(12) United States Patent
Heng et al.

(10) Patent No.: US 10,163,747 B2
(45) Date of Patent: *Dec. 25, 2018

(54) SEMICONDUCTOR DEVICE AND METHOD OF CONTROLLING WARPAGE IN RECONSTITUTED WAFER

(71) Applicant: STATS ChipPAC Pte. Ltd., Singapore (SG)

(72) Inventors: Kian Meng Heng, Singapore (SG); Hin Hwa Goh, Singapore (SG); Jose Alvin Caparas, Singapore (SG); Kang Chen, Singapore (SG); Seng Guan Chow, Singapore (SG); Yaojian Lin, Jiangyin (CN)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/461,713

(22) Filed: Mar. 17, 2017

(65) Prior Publication Data

US 2017/0194228 A1    Jul. 6, 2017

Related U.S. Application Data

(63) Continuation-in-part of application No. 14/036,193, filed on Sep. 25, 2013, now Pat. No. 9,607,965.

(51) Int. Cl.
*H01L 21/56* (2006.01)
*H01L 23/31* (2006.01)
(Continued)

(52) U.S. Cl.
CPC ........ *H01L 23/3128* (2013.01); *H01L 21/561* (2013.01); *H01L 21/568* (2013.01);
(Continued)

(58) Field of Classification Search
CPC ......... H01L 24/96; H01L 24/19; H01L 21/56; H01L 23/28
See application file for complete search history.

(56) References Cited

U.S. PATENT DOCUMENTS

2005/0266616 A1    12/2005    Weng et al.
2009/0170241 A1     7/2009    Shim et al.
(Continued)

*Primary Examiner* — Tucker J Wright
(74) *Attorney, Agent, or Firm* — Robert D. Atkins; Patent Law Group: Atkins and Associates, P.C.

(57) ABSTRACT

A semiconductor device has a substrate with a plurality of active semiconductor die disposed over a first portion of the substrate and a plurality of non-functional semiconductor die disposed over a second portion of the substrate while leaving a predetermined area of the substrate devoid of the active semiconductor die and non-functional semiconductor die. The predetermined area of the substrate devoid of the active semiconductor die and non-functional semiconductor die includes a central area, checkerboard pattern, linear, or diagonal area of the substrate. The substrate can be a circular shape or rectangular shape. An encapsulant is deposited over the active semiconductor die, non-functional semiconductor die, and substrate. An interconnect structure is formed over the semiconductor die. The absence of active semiconductor die and non-functional semiconductor die from the predetermined areas of the substrate reduces bending stress in that area of the substrate.

13 Claims, 18 Drawing Sheets

(51) Int. Cl.
*H01L 21/78* (2006.01)
*H01L 23/00* (2006.01)

(52) U.S. Cl.
CPC ............ H01L 21/78 (2013.01); H01L 23/562 (2013.01); H01L 24/19 (2013.01); H01L 24/96 (2013.01); *H01L 2224/04105* (2013.01); *H01L 2224/12105* (2013.01); *H01L 2924/01322* (2013.01); *H01L 2924/12041* (2013.01); *H01L 2924/12042* (2013.01); *H01L 2924/13091* (2013.01); *H01L 2924/181* (2013.01); *H01L 2924/3511* (2013.01); *H01L 2924/37001* (2013.01)

(56) References Cited

U.S. PATENT DOCUMENTS

| | | |
|---|---|---|
| 2011/0210104 A1 | 9/2011 | Wahlsten et al. |
| 2012/0171875 A1 | 7/2012 | Gan et al. |
| 2013/0032820 A1 | 2/2013 | Wirth |
| 2013/0147054 A1 | 6/2013 | Lin et al. |

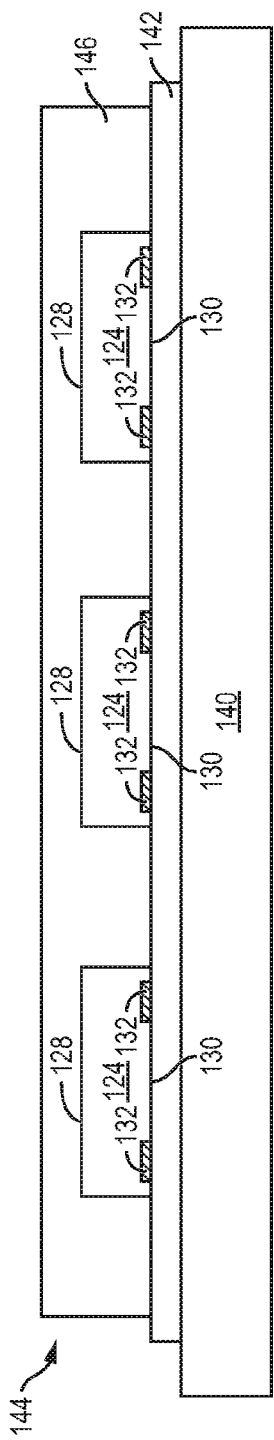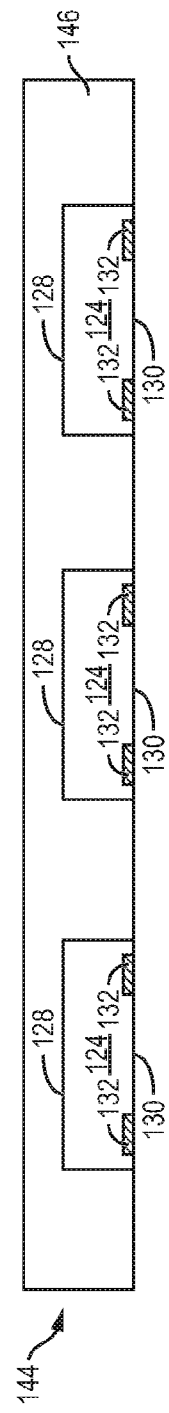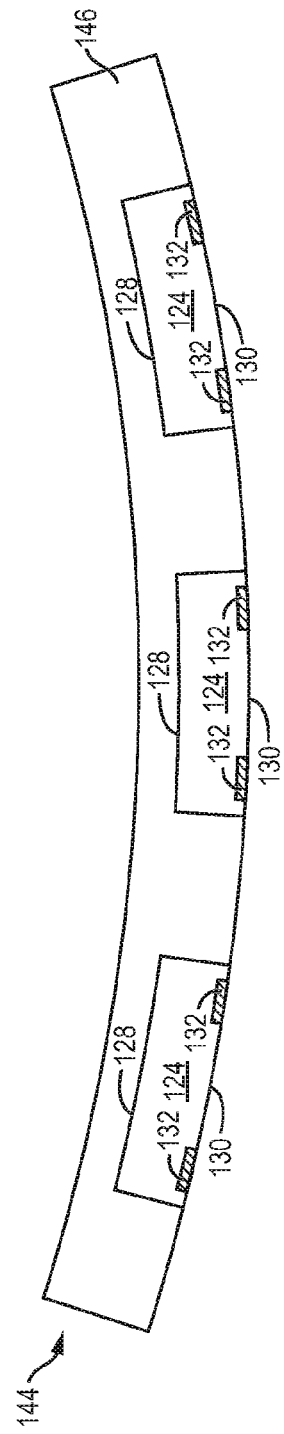

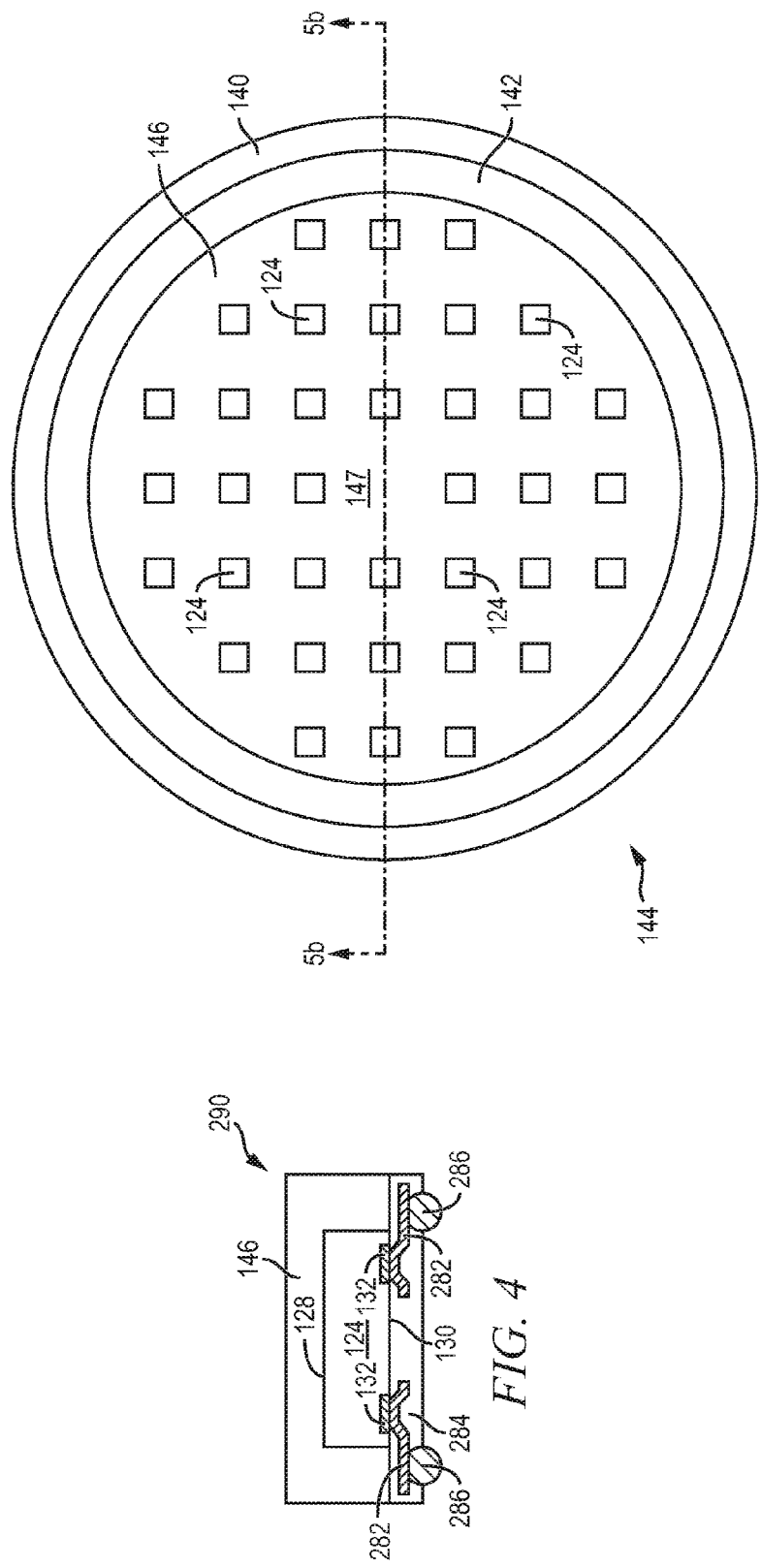
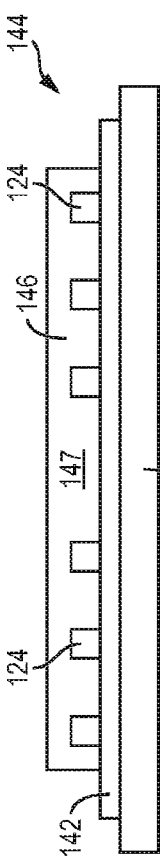
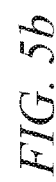

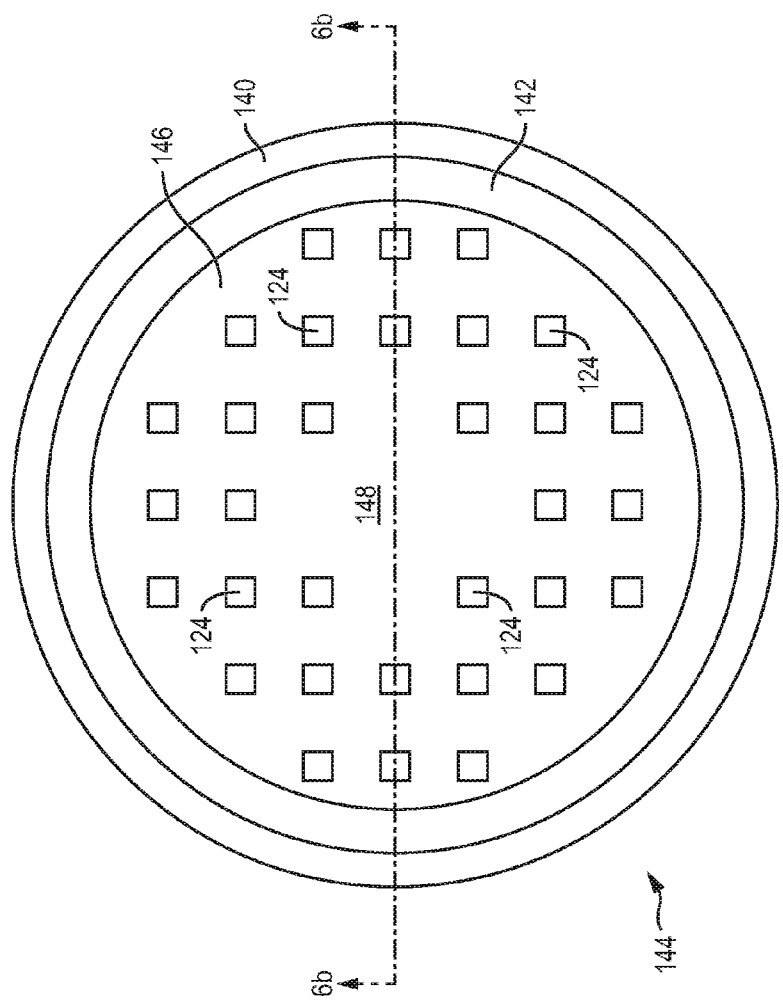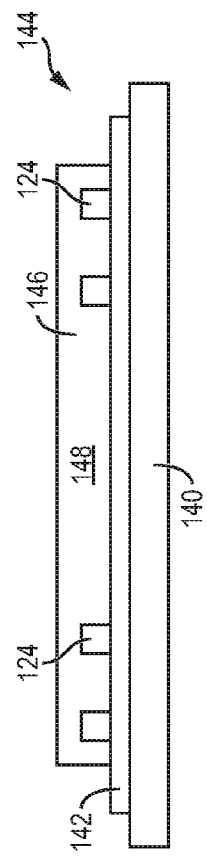
FIG. 6a
FIG. 6b

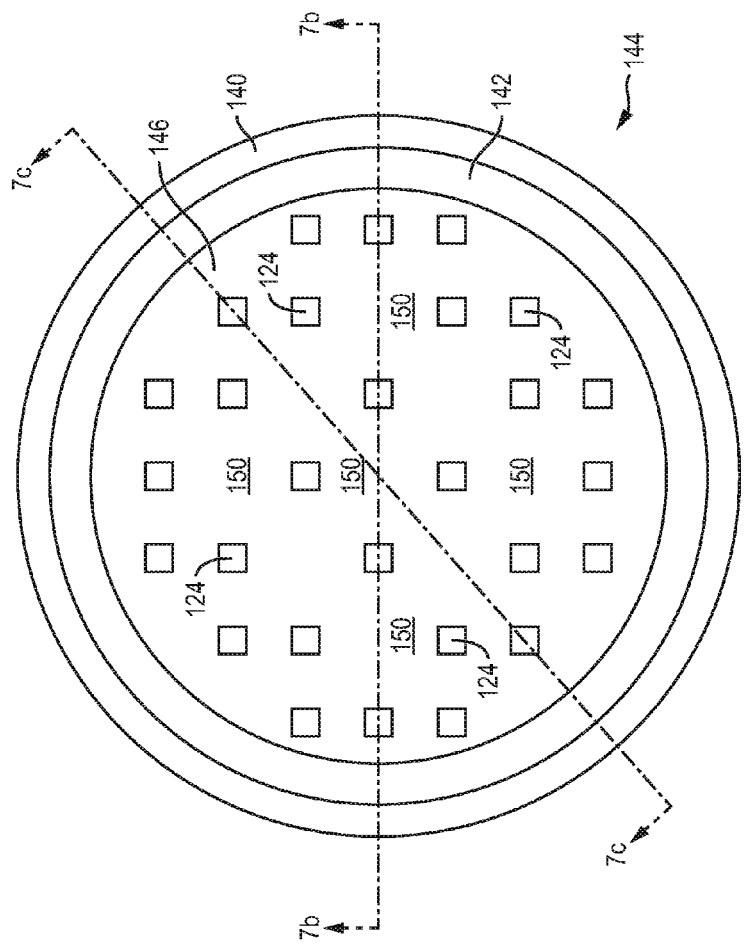
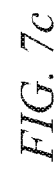
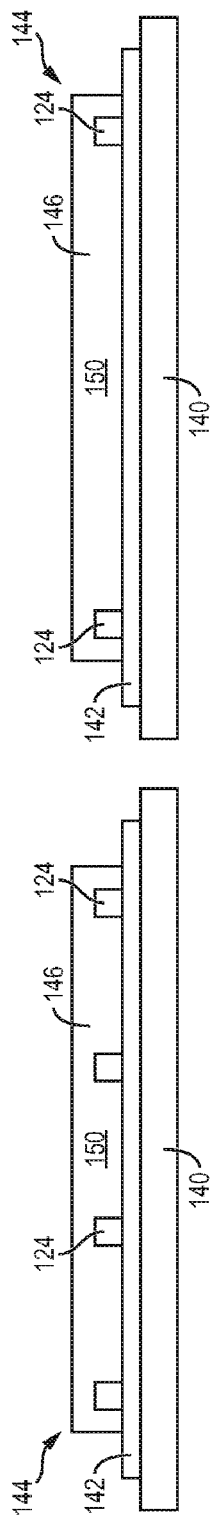
FIG. 7a
FIG. 7b
FIG. 7c

SEMICONDUCTOR DEVICE AND METHOD OF CONTROLLING WARPAGE IN RECONSTITUTED WAFER

CLAIM OF DOMESTIC PRIORITY

The present application is a continuation-in-part of U.S. patent application Ser. No. 14/036,193, now U.S. Pat. No. 9,607,965, filed Sep. 25, 2013, which application is incorporated herein by reference.

FIELD OF THE INVENTION

The present invention relates in general to semiconductor devices and, more particularly, to a semiconductor device and method of controlling warpage in a reconstituted wafer by die depopulation to leave open areas of a temporary substrate devoid of semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In manufacture of a semiconductor package, a plurality of semiconductor die can be mounted to a temporary substrate. An encapsulant is deposited over the semiconductor die and substrate. The temporary substrate is then removed. The reconstituted wafer is subject to warpage or bending after removal of the substrate due to differences in CTE of the semiconductor die and encapsulant. The warpage of the reconstituted wafer creates defects and handling issues during subsequent manufacturing steps, such as during formation of an interconnect structure over the semiconductor die and encapsulant.

BRIEF DESCRIPTION OF THE DRAWINGS

FIGS. 3a-3h illustrate a process of forming a reconstituted wafer with reduced warpage by leaving open areas of a substrate devoid of the semiconductor die;

FIG. 4 illustrates a semiconductor package after singulation from the reconstituted wafer;

FIGS. 5a-5b illustrate a circular reconstituted wafer with a semiconductor die absent from a center of the wafer;

FIGS. 6a-6b illustrate a circular reconstituted wafer with multiple semiconductor die absent from a center of the wafer;

FIGS. 7a-7c illustrate a circular reconstituted wafer with multiple open areas on the substrate devoid of semiconductor die;

DETAILED DESCRIPTION OF THE DRAWINGS

Figure 1:
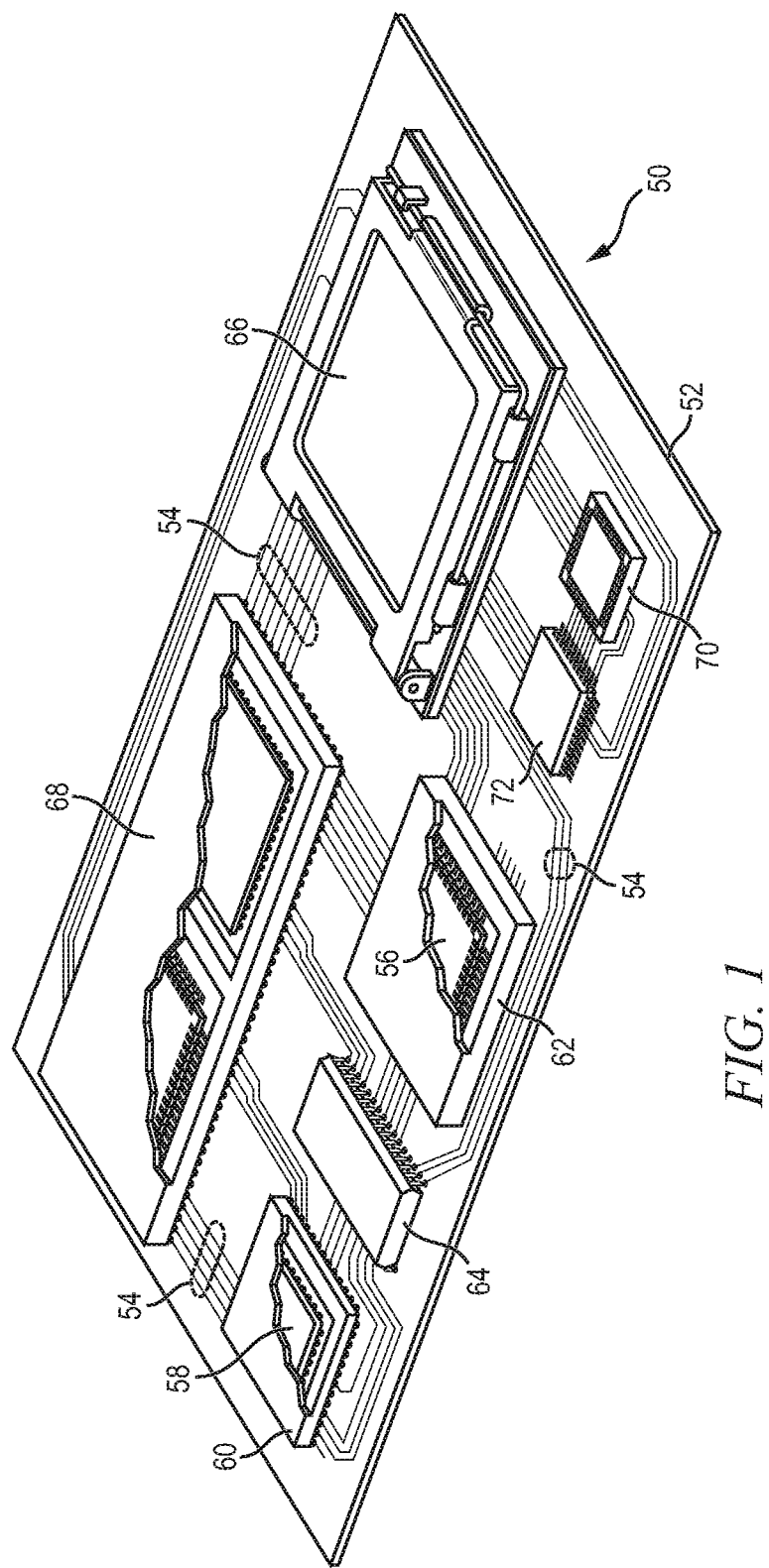
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip substrate (BCC) 62, land grid array (LGA) 66, multichip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
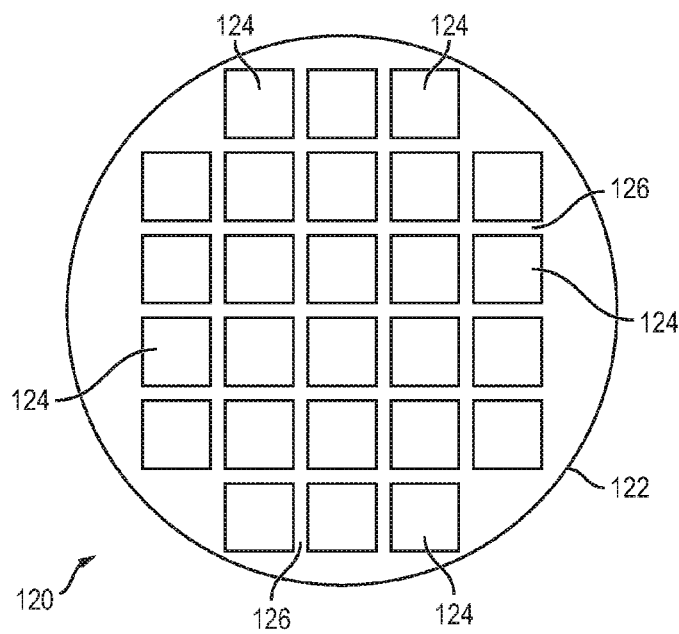
FIGS. 2a-2d illustrate a semiconductor wafer with a plurality of semiconductor die separated by a saw street.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
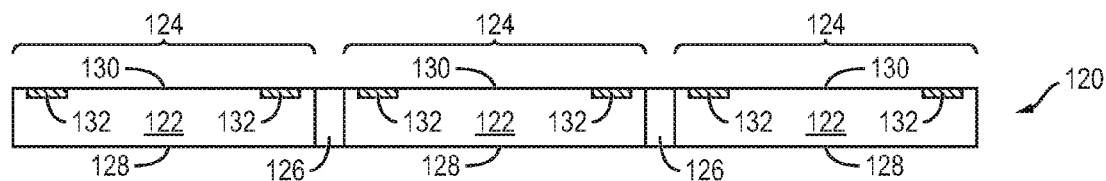

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
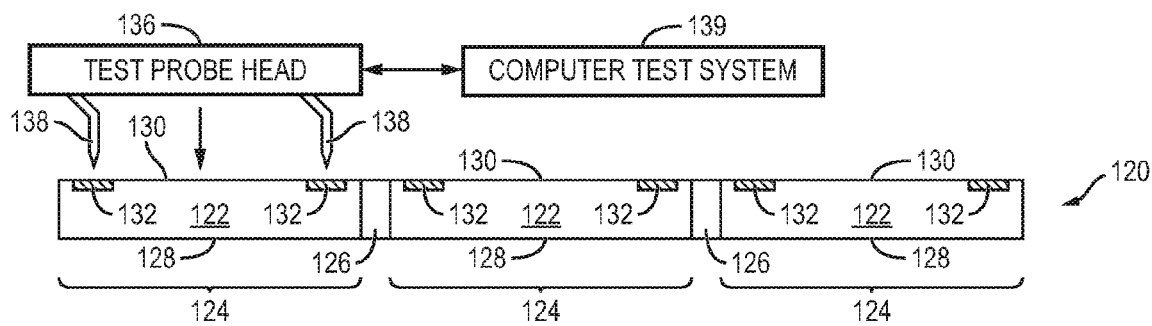

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or conductive layer 132 on each semiconductor die 124 and provide electrical stimuli to components on active surface 130. Semiconductor die 124 responds to the electrical stimuli, which is measured by computer test system 139 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 2D:
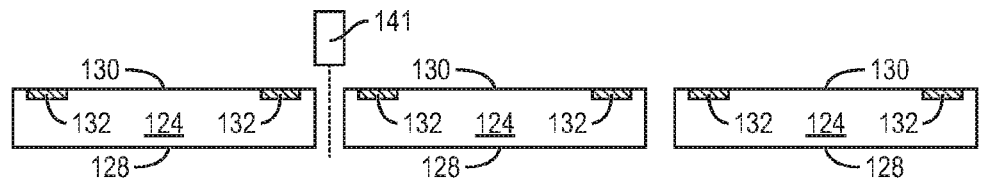

In FIG. 2d, semiconductor wafer 120 is singulated through saw street 126 using a saw blade or laser cutting tool 141 into individual semiconductor die 124. The individual semiconductor die 124 can be inspected and electrically tested for identification of KGD post singulation.

Figure 3A:
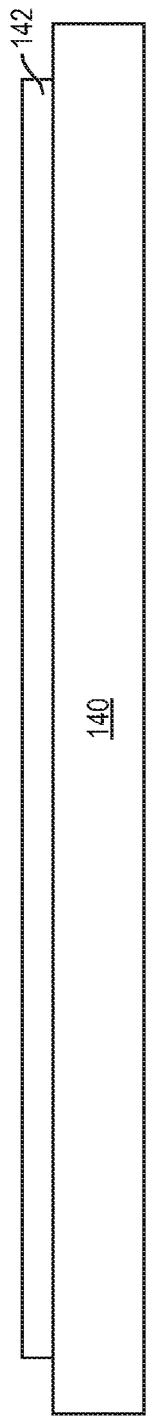

FIGS. 3a-3h illustrate, in relation to FIG. 1, a process of forming a reconstituted wafer with reduced warpage by die depopulation to leave open areas of a temporary substrate devoid of semiconductor die. FIG. 3a shows a cross-sectional view of a portion of a temporary substrate 140 containing sacrificial base material such as silicon, polymer, beryllium oxide, glass, or other suitable low-cost, rigid material for structural support. A foil layer 142 is laminated to substrate 140. Foil layer 142 can be copper or other stiffening material to reduce warpage effects. Alternatively, an interface layer or double-sided tape 142 is formed over substrate 140 as a temporary adhesive bonding film, etch-stop layer, or thermal release layer.

Substrate 140 can be a round or rectangular panel (greater than 300 mm) with capacity for multiple semiconductor die 124. Substrate 140 may have a larger surface area than the surface area of semiconductor wafer 120. A larger substrate reduces the manufacturing cost of the semiconductor package as more semiconductor die can be processed on the larger substrate thereby reducing the cost per unit. Semiconductor packaging and processing equipment are designed and configured for the size of the wafer or substrate being processed.

To further reduce manufacturing costs, the size of substrate 140 is selected independent of the size of semiconductor die 124 or size of semiconductor wafer 120. That is, substrate 140 has a fixed or standardized size, which can accommodate various size semiconductor die 124 singulated from one or more semiconductor wafers 120. In one embodiment, substrate 140 is circular with a diameter of 330 mm. In another embodiment, substrate 140 is rectangular with a width of 560 mm and length of 600 mm. Semiconductor die 124 may have dimensions of 10 mm by 10 mm, which are placed on the standardized substrate 140. Alternatively, semiconductor die 124 may have dimensions of 20 mm by 20 mm, which are placed on the same standardized substrate 140. Accordingly, standardized substrate 140 can handle any size semiconductor die 124, which allows subsequent semiconductor processing equipment to be standardized to a common substrate, i.e., independent of die size or incoming wafer size. Semiconductor packaging equipment can be designed and configured for a standard substrate using a common set of processing tools, equipment, and bill of materials to process any semiconductor die size from any incoming wafer size. The common or standardized substrate 140 lowers manufacturing costs and capital risk by reducing or eliminating the need for specialized semiconductor processing lines based on die size or incoming wafer size. By selecting a predetermined substrate size to use for any size semiconductor die from all semiconductor wafer, a flexible manufacturing line can be implemented.

Figure 3B:
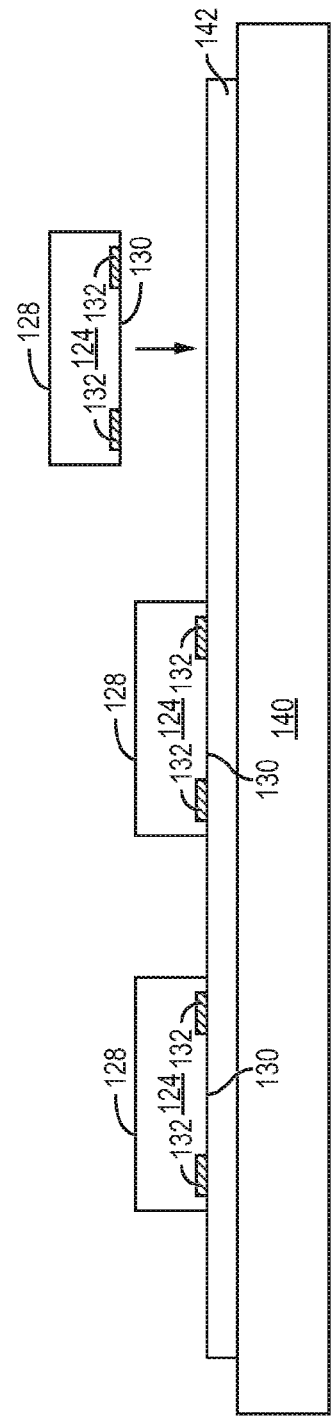
Figure 3C:
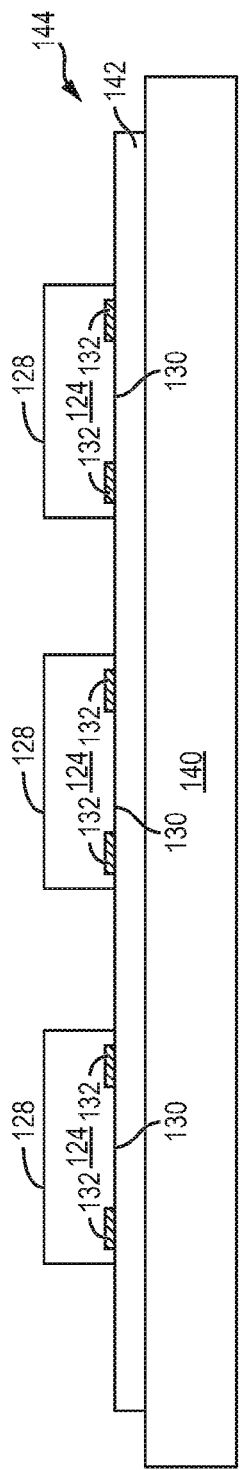

In FIG. 3b, semiconductor die 124 from FIG. 2d are mounted to substrate 140 and foil layer 142 using, for example, a pick and place operation with active surface 130 oriented toward the substrate. FIG. 3c shows semiconductor die 124 mounted to foil layer 142 of substrate 140 as reconstituted or reconfigured wafer 144 having a width or diameter of 330 mm.

Reconstituted wafer 144 can be processed into many types of semiconductor packages, including embedded wafer level ball grid array (eWLB), fan-in wafer level chip scale packages (WLCSP), reconstituted or embedded wafer level chip scale packages (eWLCSP), fan-out WLCSP, flip-chip packages, three dimensional (3D) packages, such as package-on-package (PoP), or other semiconductor packages. Reconstituted wafer 144 is configured according to the specifications of the resulting semiconductor package. In one embodiment, semiconductor die 124 are placed on substrate 140 in a high-density arrangement, i.e., 300 micrometers (μm) apart or less, for processing fan-in devices. In another embodiment, semiconductor die 124 are separated by a distance of 50 μm on substrate 140. The distance between semiconductor die 124 on substrate 140 is optimized for manufacturing the semiconductor packages at the lowest unit cost. The larger surface area of substrate 140 accommodates more semiconductor die 124 and lowers manufacturing cost as more semiconductor die 124 are processed per reconstituted wafer 144. The number of semiconductor die 124 mounted to substrate 140 can be greater than the number of semiconductor die 124 singulated from semiconductor wafer 120. Substrate 140 and reconstituted wafer 144 provide the flexibility to manufacture many different types of semiconductor packages using different size semiconductor die 124 from different sized semiconductor wafers 120.

In FIG. 3d, an encapsulant or molding compound 146 is deposited over semiconductor die 124 and substrate 140 using a paste printing, compressive molding, transfer molding, liquid encapsulant molding, vacuum lamination, spin coating, or other suitable applicator. In particular, encapsulant 146 covers the four side surfaces and back surface 128 of semiconductor die 124 with a thickness of 470 μm. Encapsulant 146 can be polymer composite material, such as epoxy resin with filler, epoxy acrylate with filler, or polymer with proper filler. Encapsulant 146 is non-conductive and environmentally protects the semiconductor device from external elements and contaminants. Encapsulant 146 also protects semiconductor die 124 from degradation due to exposure to light.

In FIG. 3e, substrate 140 and foil layer 142 are removed by chemical etching, mechanical peeling, chemical mechanical planarization (CMP), mechanical grinding, thermal bake, UV light, laser scanning, or wet stripping to expose active surface 130 and conductive layer 132. Back surface 128 of semiconductor die 124, as well as the sides of the semiconductor die, remain covered by encapsulant 146 as a protective panel to increase yield, particularly when surface mounting the semiconductor die.

Reconstituted wafer 144 is subject to warpage or bending, as shown in FIG. 3f, after removal of substrate 140 and foil layer 142 due to differences in CTE of semiconductor die 124 and encapsulant 146, as well as chemical cure shrinkage effect of the encapsulant. For a circular substrate 140 with a diameter of 305 mm, reconstituted wafer 144 may exhibit a warpage or bend of −2.0 mm.

Having noted the warpage issue, FIG. 5a returns to the state of reconstituted wafer 144 prior to removal of substrate 140 and foil layer 142. In particular, FIG. 5a shows a plan view of circular reconstituted wafer 144 with semiconductor die 124 mounted to foil layer 142 and substrate 140 and covered by encapsulant 146, i.e., consistent with FIG. 3d. Substrate 140 has sufficient size to accommodate multiple semiconductor die 124 arranged in columns and rows across the substrate.

A conventional layout of substrate 140 would suggest that a maximum number of semiconductor die 124 should be placed on substrate 140, i.e., all available substrate space should be utilized. The layout of semiconductor die should use all available space of the substrate for maximum throughput of die per substrate. However, to reduce the warpage of reconstituted wafer 144, certain areas of substrate 140 are depopulated of semiconductor die 124 to leave open space, i.e., no semiconductor die 124 are mounted to predetermined and selected areas of substrate 140. In the case of FIG. 5a, no semiconductor die 124 is mounted to central area 147 of substrate 140. In other words, whereas central area 147 could have accommodated at least one semiconductor die 124, the central area of substrate 140 is devoid of the potential semiconductor die 124. FIG. 5b shows a cross-sectional view of reconstituted wafer 144 taken along line segment 5b-5b of FIG. 5a with no semiconductor die 124 mounted to central area 147 of substrate 140.

In another embodiment, FIG. 6a shows a plan view of circular reconstituted wafer 144 prior to removal of substrate 140 with semiconductor die 124 mounted to foil layer 142 and substrate 140 and covered by encapsulant 146. To reduce the warpage of reconstituted wafer 144 after removal of substrate 140, central area 148 is depopulated of semiconductor die 124 to leave open space, i.e., no semiconductor die 124 are mounted to central area 148 of substrate 140. Whereas central area 148 could have accommodated multiple semiconductor die 124 in one or more partial rows and columns of available space, the central area of substrate 140 is devoid of those potential semiconductor die 124. In particular, area 148 that is devoid of semiconductor die 124 has a "+" shape, as shown in FIG. 6a. FIG. 6b shows a cross-sectional view of reconstituted wafer 144 taken along line segment 6b-6b of FIG. 6a with no semiconductor die 124 mounted in central area 148 of substrate 140.

In another embodiment, FIG. 7a shows a plan view of circular reconstituted wafer 144 prior to removal of substrate 140 with semiconductor die 124 mounted to foil layer 142 and substrate 140 and covered by encapsulant 146. To reduce the warpage of reconstituted wafer 144 after removal of substrate 140, areas 150 is depopulated of semiconductor die 124 to leave open space, i.e., no semiconductor die 124 are mounted to areas 150 of substrate 140. Whereas areas 150 could have accommodated multiple semiconductor die 124 in one or more partial rows and columns of available space, areas 150 of substrate 140 are devoid of those potential semiconductor die 124. In particular, areas 150 that are devoid of semiconductor die 124 include a central region of substrate 140 and interstitial locations within the rows and columns of semiconductor die 124, as shown in FIG. 7a. For example, the leftmost column of semiconductor die 124 in substrate 140 has no open locations. The second leftmost column of semiconductor die 124 in substrate 140 has one open interstitial location between the upper two semiconductor die 124 and the lower two semiconductor die 124. The third leftmost column of semiconductor die 124 in substrate 140 has two open interstitial locations. The center column of semiconductor die 124 in substrate 140 has three open interstitial locations alternating between semiconductor die 124. The rightmost column of semiconductor die 124 in substrate 140 has no open locations. The second rightmost column of semiconductor die 124 in substrate 140 has one open interstitial location between the upper two semiconductor die 124 and the lower two semiconductor die 124. The third rightmost column of semiconductor die 124 in substrate 140 has two open interstitial locations. FIG. 7b shows a cross-sectional view of reconstituted wafer 144 taken along line segment 7b-7b of FIG. 7a with no semiconductor die 124 mounted in areas 150 of substrate 140. FIG. 7c shows a cross-sectional view of reconstituted wafer 144 taken along line segment 7c-7c of FIG. 7a with no semiconductor die 124 mounted in areas 150 of substrate 140.

The absence of semiconductor die 124 from selected areas 147-148 or 150 of substrate 140 reduces bending stress in that area of the substrate. By leaving selected areas 147-148 or 150 of substrate 140 devoid of semiconductor die 124, the warping effect of any mismatch between the CTE of semiconductor die 124 and the CTE of encapsulant 146 on reconstituted wafer 144 after removal of substrate 140 is reduced. In the case of circular substrate 140, depopulating semiconductor die 124 from central areas 147-148 or areas 150 of substrate 140 has a significant effect on out-of-plane deformation. Without semiconductor die 124 in central areas 147-148 or areas 150, CTE mismatch and modulus are reduced as the deflection point is shifted away from the center of the substrate. Any warpage at peripheral regions of substrate 140 should dominate after removal of the substrate. Retaining semiconductor die 124 around a perimeter of substrate 140 helps maintain structural rigidity for the ease of handling. Alternatively, non-functional (dummy) die or other stiffening support components are disposed around a perimeter of substrate 140 for structural rigidity and ease of handling.

The number and location of areas 147-148 or 150 of substrate 140 absent semiconductor die 124 is a function of the size and shape of the substrate. For circular substrate 140 with a diameter of 305 mm and given five to ten semiconductor die 124 absent from a "+" shape area 148, the post substrate removal warpage is reduced to about −1.4 mm in a 14×14 eWLB package. The reduction in warpage increases yield through subsequent manufacturing processes, e.g., formation of the interconnect structure of FIG. 3g, without significant loss of overall throughput, even given the fact there are fewer semiconductor die 124 per substrate 140. The yield loss due to the absence of some semiconductor die 124 from substrate 140 is mitigated in part by the lower failure rate of the semiconductor die during formation of the interconnect structure in subsequent manufacturing processes.

In addition, the absence of semiconductor die 124 from central areas 147-148 or areas 150 reduces stiffness of reconstituted wafer 144. Depending on the device structure, some reconstituted wafers exhibit an abrupt change of warpage, for example, directly from −2.0 mm to +2.0 mm. By selectively removing semiconductor die 124 from central areas 147-148 or areas 150, reconstituted wafer 144 relaxes and the warpage can be adjusted to the acceptable range.

Figure 8:
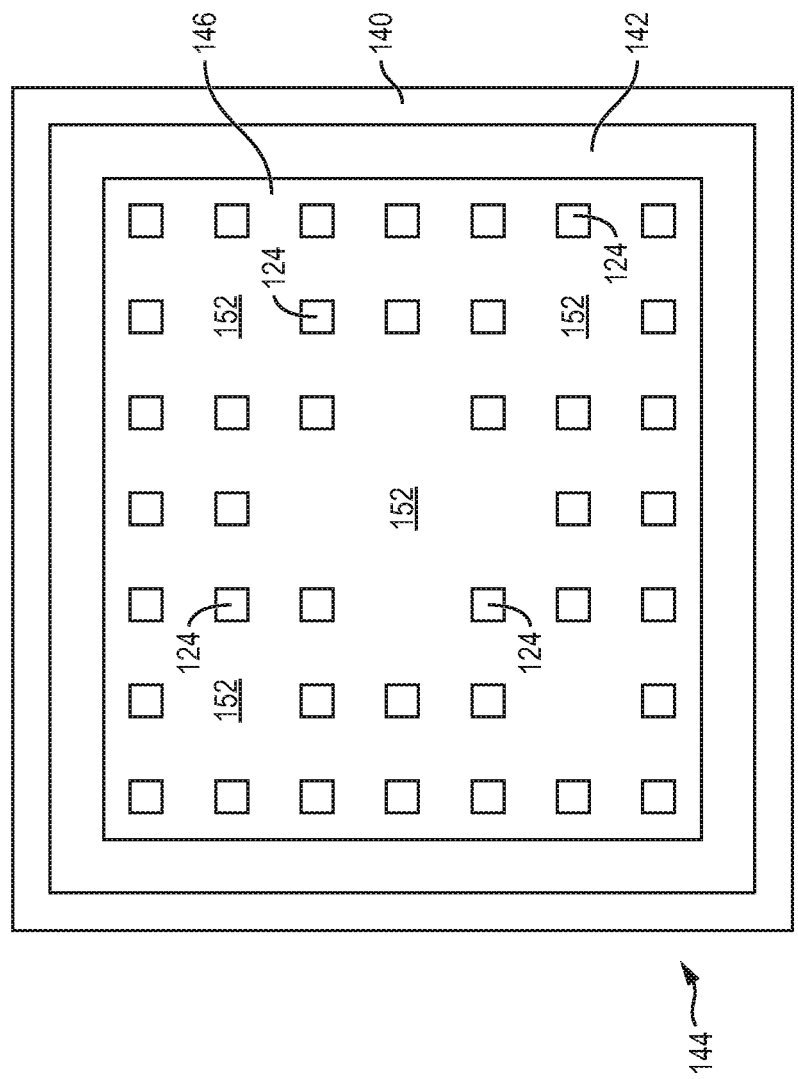
FIG. 8 illustrates a rectangular reconstituted wafer with interstitial open locations on the substrate.

FIG. 8 shows a plan view of rectangular reconstituted wafer 144 prior to removal of substrate 140 with semiconductor die 124 mounted to foil layer 142 and substrate 140 and covered by encapsulant 146. To reduce the warpage of reconstituted wafer 144 after removal of substrate 140, areas 152 is depopulated of semiconductor die 124 to leave open space, i.e., no semiconductor die 124 are mounted to areas 152 of substrate 140. Whereas areas 152 could have accommodated multiple semiconductor die 124 in one or more partial rows and columns of available space, areas 152 of substrate 140 are devoid of those potential semiconductor die 124. In particular, areas 152 that are devoid of semiconductor die 124 include a central region of substrate 140 and interstitial locations within the rows and columns of semiconductor die 124, as shown in FIG. 8. The leftmost column of semiconductor die 124 in substrate 140 has no open locations. The second leftmost column of semiconductor die 124 in substrate 140 has two open interstitial locations. The third leftmost column of semiconductor die 124 in substrate 140 has one open interstitial location. The center column of semiconductor die 124 in substrate 140 has three open and concurrent interstitial locations. The rightmost column of semiconductor die 124 in substrate 140 has no open locations. The second rightmost column of semiconductor die 124 in substrate 140 has two open interstitial locations. The third rightmost column of semiconductor die 124 in substrate 140 has one open interstitial location.

Figure 9:
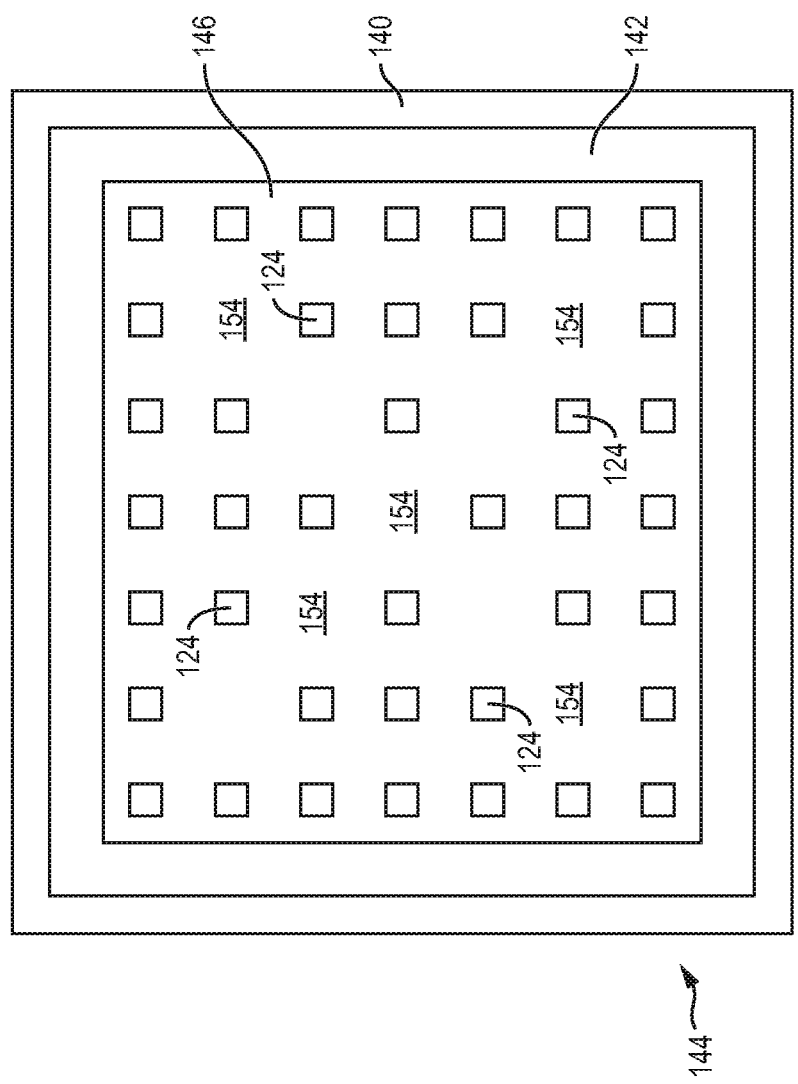
FIG. 9 illustrates another rectangular reconstituted wafer with interstitial open locations on the substrate.

FIG. 9 shows a plan view of another embodiment of rectangular reconstituted wafer 144 prior to removal of substrate 140 with semiconductor die 124 mounted to foil layer 142 and substrate 140 and covered by encapsulant 146. To reduce the warpage of reconstituted wafer 144 after removal of substrate 140, areas 154 is depopulated of semiconductor die 124 to leave open space, i.e., no semiconductor die 124 are mounted to areas 154 of substrate 140. Whereas areas 154 could have accommodated multiple semiconductor die 124 in one or more partial rows and columns of available space, areas 154 of substrate 140 are devoid of those potential semiconductor die 124. In particular, areas 154 that are devoid of semiconductor die 124 include a central region of substrate 140 and interstitial locations within the rows and columns of semiconductor die 124, as shown in FIG. 9. The leftmost column of semiconductor die 124 in substrate 140 has no open locations. The second leftmost column of semiconductor die 124 in substrate 140 has two open interstitial locations. The third leftmost column of semiconductor die 124 in substrate 140 has two open interstitial locations. The center column of semiconductor die 124 in substrate 140 has one open interstitial location. The rightmost column of semiconductor die 124 in substrate 140 has no open locations. The second rightmost column of semiconductor die 124 in substrate 140 has two open interstitial locations. The third rightmost column of semiconductor die 124 in substrate 140 has two open interstitial locations.

Figure 10:
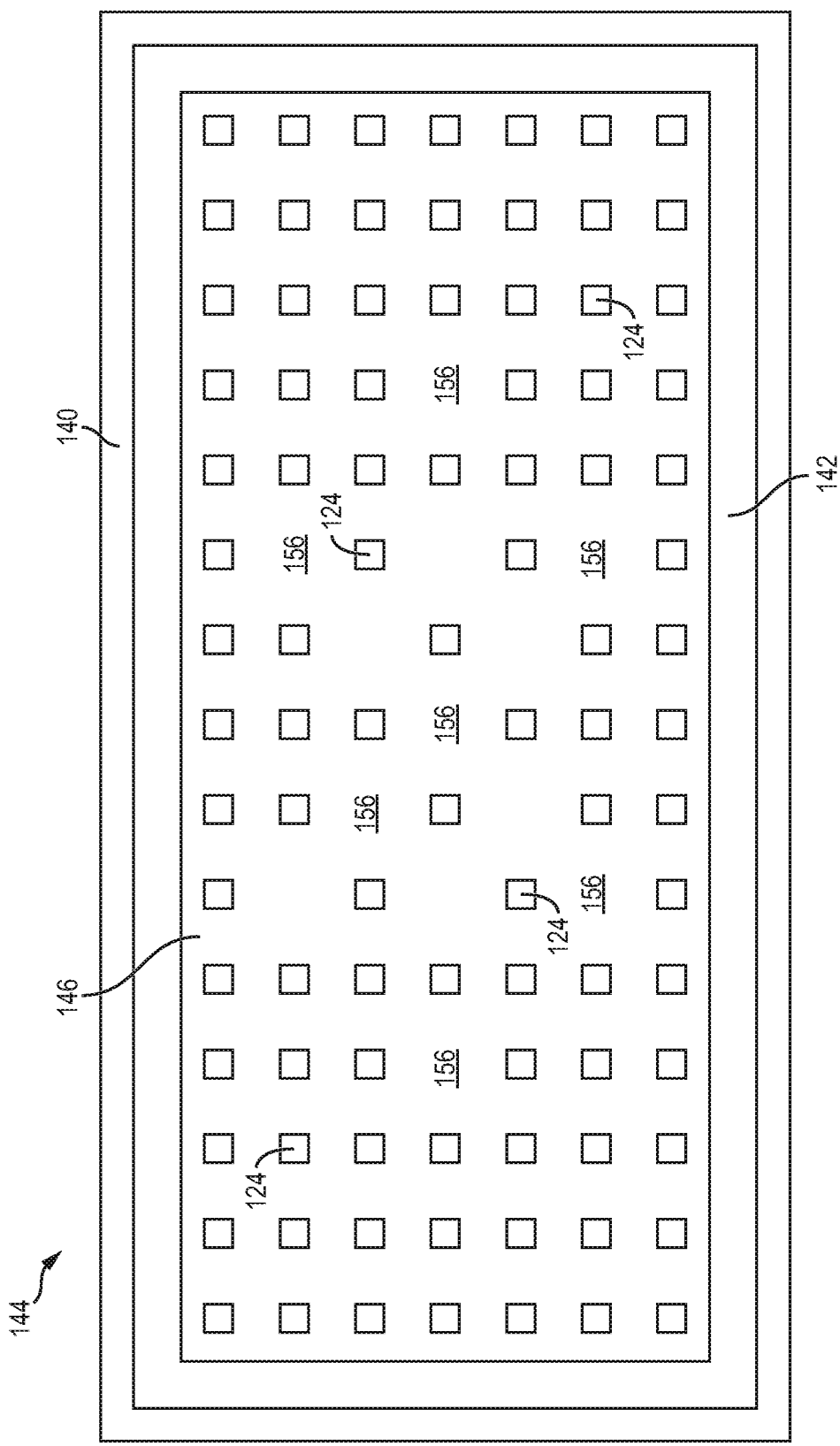
FIG. 10 illustrates another rectangular reconstituted wafer with interstitial open locations on the substrate.

FIG. 10 shows a plan view of another embodiment of rectangular reconstituted wafer 144 prior to removal of substrate 140 with semiconductor die 124 mounted to foil layer 142 and substrate 140 and covered by encapsulant 146.

To reduce the warpage of reconstituted wafer 144 after removal of substrate 140, areas 156 is depopulated of semiconductor die 124 to leave open space, i.e., no semiconductor die 124 are mounted to areas 156 of substrate 140. Whereas areas 156 could have accommodated multiple semiconductor die 124 in one or more partial rows and columns of available space, areas 156 of substrate 140 are devoid of those potential semiconductor die 124. In particular, areas 156 that are devoid of semiconductor die 124 include a central region of substrate 140 and interstitial locations within the rows and columns of semiconductor die 124, as shown in FIG. 10.

Figure 11:
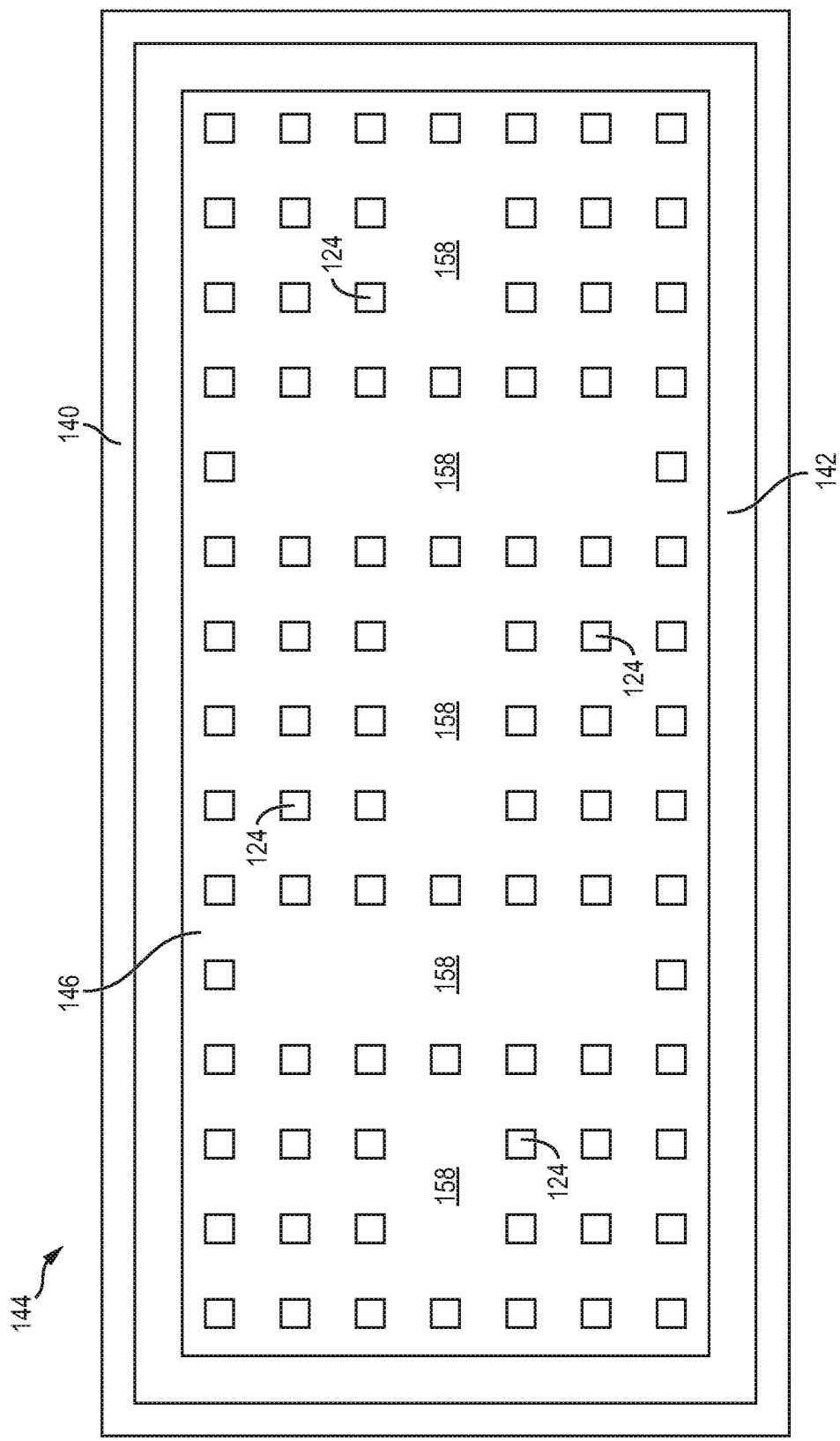
FIG. 11 illustrates another rectangular reconstituted wafer with interstitial open locations on the substrate.

FIG. 11 shows a plan view of another embodiment of rectangular reconstituted wafer 144 prior to removal of substrate 140 with semiconductor die 124 mounted to foil layer 142 and substrate 140 and covered by encapsulant 146. To reduce the warpage of reconstituted wafer 144 after removal of substrate 140, areas 158 is depopulated of semiconductor die 124 to leave open space, i.e., no semiconductor die 124 are mounted to areas 158 of substrate 140. Whereas areas 158 could have accommodated multiple semiconductor die 124 in one or more partial rows and columns of available space, areas 158 of substrate 140 are devoid of those potential semiconductor die 124. In particular, areas 158 that are devoid of semiconductor die 124 include a central region of substrate 140 and interstitial locations within the rows and columns of semiconductor die 124, as shown in FIG. 11.

Figure 12A:
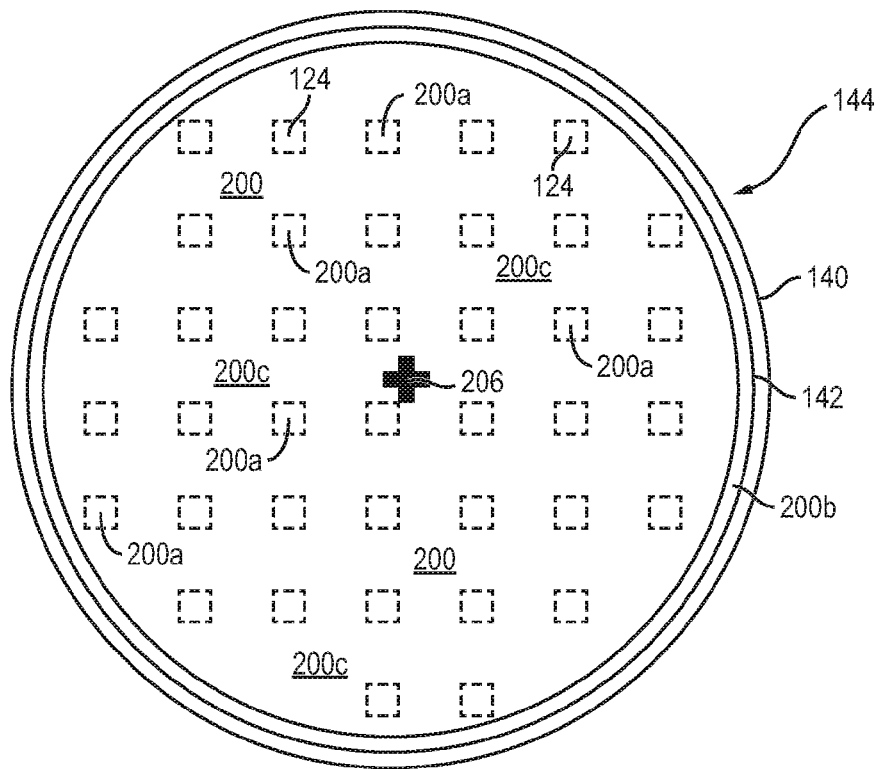
FIGS. 12a-12c illustrate a reconstituted wafer with semiconductor die and a central open area devoid of semiconductor die.

FIG. 12a shows a plan view of circular reconstituted wafer 144 with die attach area 200 on substrate 140. Active semiconductor die 124 and non-functional dummy semiconductor die 202 are mounted to foil layer 142 and substrate 140 in die attach area 200. Active semiconductor die 124 and dummy semiconductor die 202 are covered by encapsulant 146, i.e., consistent with FIG. 3d. Substrate 140 has sufficient size to accommodate multiple semiconductor die 124 and dummy semiconductor die 202 arranged in columns and rows across the substrate. In particular, active semiconductor die 124 are mounted to die attach area 200a in an interior region of substrate 140. The interior die attach areas 200a contain clusters of multiple active semiconductor die 124, e.g., four or more active semiconductor die 124 per cluster. Active semiconductor die 124 and/or dummy semiconductor die 202 are also mounted to die attach area 200b around a perimeter of substrate 140. The perimeter die attach areas 200b is a ring of active semiconductor die 124 and/or dummy semiconductor die 202, e.g., one or more active semiconductor die 124 disposed across a width of the ring. Dummy semiconductor die 202 and/or dummy semiconductor die 202 are disposed in die attach area 200c located between die attach areas 200a-200b. Alternatively, active semiconductor die 124 are disposed in die attach areas 200b.

Figure 12B:
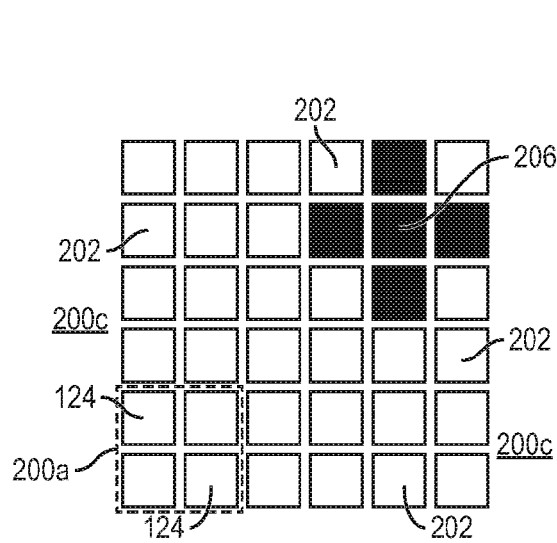
Figure 12C:
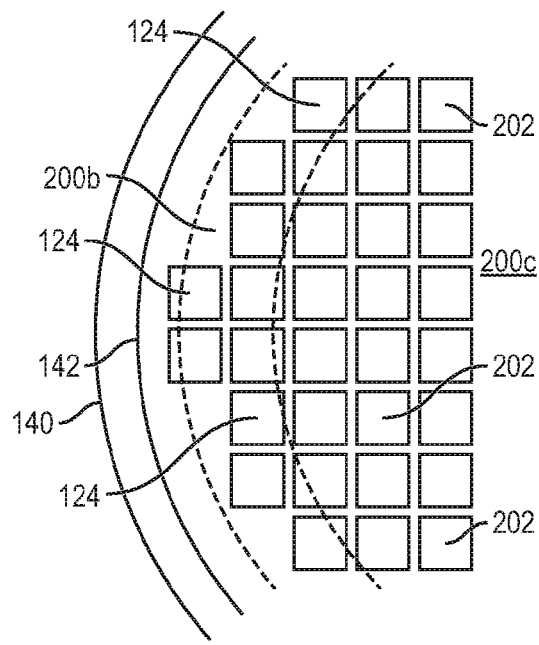

To reduce the warpage of reconstituted wafer 144, certain areas of substrate 140 are depopulated of semiconductor die 124 and dummy semiconductor die 202 to leave open space 206 shown as solid black areas, i.e., no semiconductor die are disposed in predetermined and selected areas 206 of substrate 140. In the case of FIG. 12a, no semiconductor die 124 or dummy semiconductor die 202 are disposed in central area 206 of substrate 140. In other words, whereas central area 206 could have accommodated one or more semiconductor die 124 or dummy semiconductor die 202, central area 206 of substrate 140 is devoid of the potential semiconductor die. Central area 206 that is devoid of semiconductor die 124 or dummy semiconductor die 202 includes a "+" shape, e.g., four solid black locations on each side around one central solid black location. FIG. 12b shows a focused view of area 206 in solid black devoid of semiconductor die 124 and 202, and die attach areas 200a and 200c with active semiconductor die 124 and dummy semiconductor die 202. FIG. 12c shows a focused view of die attach areas 200b and 200c with active semiconductor die 124 and dummy semiconductor die 202.

Figure 13A:
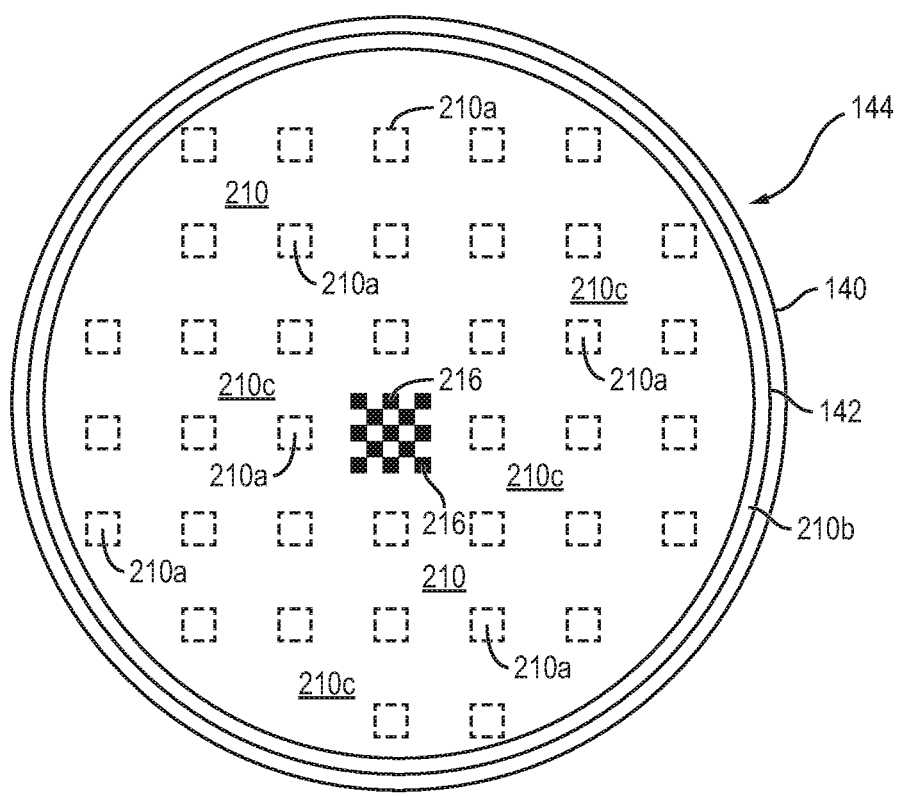
FIGS. 13a-13b illustrate a reconstituted wafer with semiconductor die and a checkerboard pattern open area devoid of semiconductor die.

FIG. 13a shows a plan view of circular reconstituted wafer 144 with die attach area 210 on substrate 140. Active semiconductor die 124 and non-functional dummy semiconductor die 212 are mounted to foil layer 142 and substrate 140 in die attach area 210. Active semiconductor die 124 and dummy semiconductor die 212 are covered by encapsulant 146, i.e., consistent with FIG. 3d. Substrate 140 has sufficient size to accommodate multiple semiconductor die 124 and dummy semiconductor die 212 arranged in columns and rows across the substrate. In particular, active semiconductor die 124 are mounted to die attach area 210a in an interior region of substrate 140. The interior die attach areas 210a contain clusters of multiple active semiconductor die 124, e.g., four or more active semiconductor die 124 per cluster. Active semiconductor die 124 and/or dummy semiconductor die 212 are also mounted to die attach area 210b around a perimeter of substrate 140. The perimeter die attach areas 210b is a ring of active semiconductor die 124 and/or dummy semiconductor die 212, e.g., one or more active semiconductor die 124 and/or dummy semiconductor die 212 disposed across a width of the ring. Dummy semiconductor die 212 are disposed in die attach area 210c located between die attach areas 210a-210b. Alternatively, active semiconductor die 124 are disposed in die attach areas 210b.

Figure 13B:
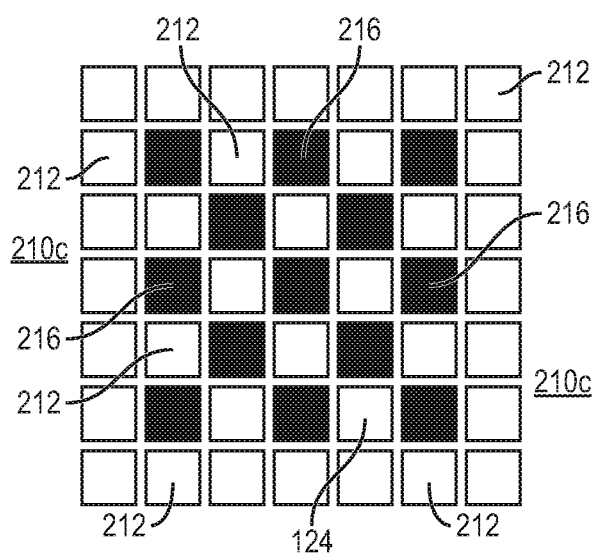

To reduce the warpage of reconstituted wafer 144, certain areas of substrate 140 are depopulated of semiconductor die 124 and dummy semiconductor die 212 to leave open space 216 shown as solid black areas, i.e., no semiconductor die are disposed in predetermined and selected areas 216 of substrate 140. In the case of FIG. 13a, no semiconductor die 124 or dummy semiconductor die 212 are disposed in area 216 of substrate 140. In other words, whereas area 216 could have accommodated one or more semiconductor die 124 or dummy semiconductor die 212, area 216 of substrate 140 is devoid of the potential semiconductor die. The area 216 that is devoid of semiconductor die 124 or dummy semiconductor die 212 includes a checkerboard pattern shown in solid black with semiconductor die 124 or dummy semiconductor die 212 disposed within the checkerboard pattern. FIG. 13b shows a focused view of area 216 in solid black devoid of semiconductor die 124 and 212 and with semiconductor die 124 or dummy semiconductor die 212 disposed within the checkerboard pattern, and die attach areas 210a and 210c with active semiconductor die 124 and dummy semiconductor die 212.

Figure 14:
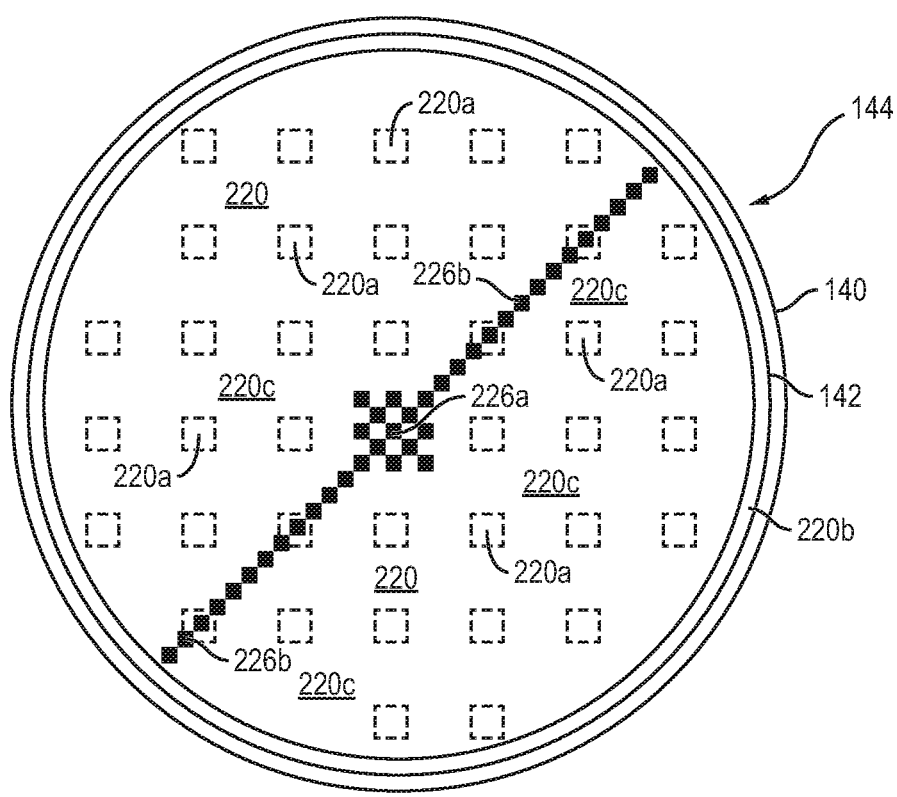
FIG. 14 illustrates a reconstituted wafer with semiconductor die and a checkerboard pattern and diagonal open area devoid of semiconductor die.

FIG. 14 shows a plan view of circular reconstituted wafer 144 with die attach area 220 on substrate 140. Active semiconductor die 124 and non-functional dummy semiconductor die 222 are mounted to foil layer 142 and substrate 140 in die attach area 220. Active semiconductor die 124 and dummy semiconductor die 222 are covered by encapsulant 146, i.e., consistent with FIG. 3d. Substrate 140 has sufficient size to accommodate multiple semiconductor die 124 and dummy semiconductor die 222 arranged in columns and rows across the substrate. In particular, active semiconductor die 124 are mounted to die attach area 220a in an interior region of substrate 140. The interior die attach areas 220a contain clusters of multiple active semiconductor die 124, e.g., four or more active semiconductor die 124 per cluster. Active semiconductor die 124 and/or dummy semiconductor die 222 are also mounted to die attach area 220b around a perimeter of substrate 140. The perimeter die attach areas 220b is a ring of active semiconductor die 124 and/or dummy semiconductor die 222, e.g., one or more active semiconductor die 124 and/or dummy semiconductor die 222 disposed across a width of the ring. Dummy semiconductor die 222 are disposed in die attach area 220c located between die attach areas 220a-220b. Alternatively, active semiconductor die 124 are disposed in die attach areas 220b.

To reduce the warpage of reconstituted wafer 144, certain areas of substrate 140 are depopulated of semiconductor die 124 and dummy semiconductor die 222 to leave open space 226 shown as solid black areas, i.e., no semiconductor die are disposed in predetermined and selected areas 226 of substrate 140. In the case of FIG. 14, no semiconductor die 124 or dummy semiconductor die 222 are disposed in area 226 of substrate 140. In other words, whereas area 226 could have accommodated one or more semiconductor die 124 or dummy semiconductor die 222, area 226 of substrate 140 is devoid of the potential semiconductor die. The area 226 that is devoid of semiconductor die 124 or dummy semiconductor die 222 includes a checkerboard pattern 226a in solid black with semiconductor die 124 or dummy semiconductor die 222 disposed within the checkerboard pattern and diagonal area 226b in solid black extending from the checkerboard pattern across substrate 140 to die attach area 220b.

Figure 15A:
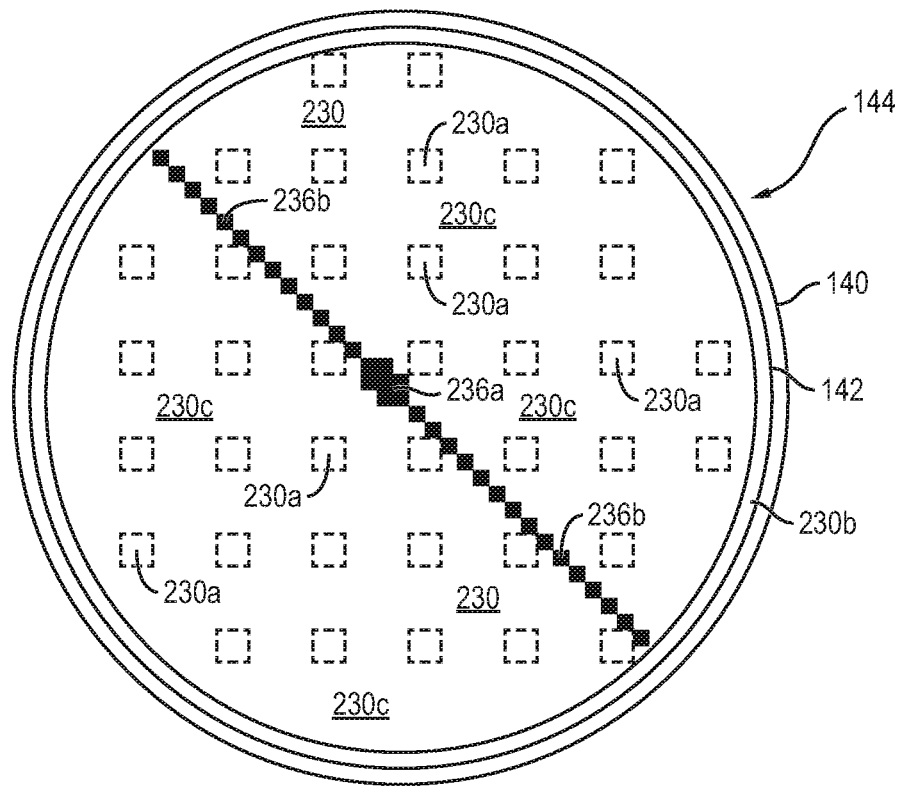
FIGS. 15a-15b illustrate a reconstituted wafer with semiconductor die and a central area and diagonal area devoid of semiconductor die.

FIG. 15a shows a plan view of circular reconstituted wafer 144 with die attach area 230 on substrate 140. Active semiconductor die 124 and non-functional dummy semiconductor die 232 are mounted to foil layer 142 and substrate 140 in die attach area 230. Active semiconductor die 124 and dummy semiconductor die 232 are covered by encapsulant 146, i.e., consistent with FIG. 3d. Substrate 140 has sufficient size to accommodate multiple semiconductor die 124 and dummy semiconductor die 232 arranged in columns and rows across the substrate. In particular, active semiconductor die 124 are mounted to die attach area 230a in an interior region of substrate 140. The interior die attach areas 230a contain clusters of multiple active semiconductor die 124, e.g., four or more active semiconductor die 124 per cluster. Active semiconductor die 124 and/or dummy semiconductor die 232 are also mounted to die attach area 230b around a perimeter of substrate 140. The perimeter die attach areas 230b is a ring of active semiconductor die 124 and/or dummy semiconductor die 232, e.g., one or more active semiconductor die 124 and/or dummy semiconductor die 232 disposed across a width of the ring. Dummy semiconductor die 232 are disposed in die attach area 230c located between die attach areas 230a-230b. Alternatively, active semiconductor die 124 are disposed in die attach areas 230b.

Figure 15B:
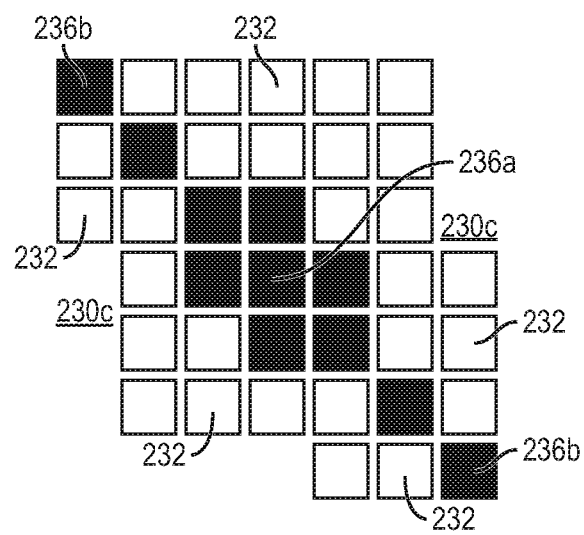

To reduce the warpage of reconstituted wafer 144, certain areas of substrate 140 are depopulated of semiconductor die 124 and dummy semiconductor die 232 to leave open space 236 shown as solid black areas, i.e., no semiconductor die are disposed in predetermined and selected areas 236 of substrate 140. In the case of FIG. 15a, no semiconductor die 124 or dummy semiconductor die 232 are disposed in area 236 of substrate 140. In other words, whereas area 236 could have accommodated one or more semiconductor die 124 or dummy semiconductor die 232, area 236 of substrate 140 is devoid of the potential semiconductor die. The area 236 that is devoid of semiconductor die 124 or dummy semiconductor die 232 includes a central area 236a and diagonal area 236b in solid black. Diagonal area 236b extends from the central area 236a diagonally across substrate 140 to die attach area 230b. FIG. 15b shows a focused view of central area 236a and a portion of diagonal area 236b in solid black devoid of semiconductor die 124 and 232, and die attach areas 230a and 230c with active semiconductor die 124 and dummy semiconductor die 232.

Figure 16:
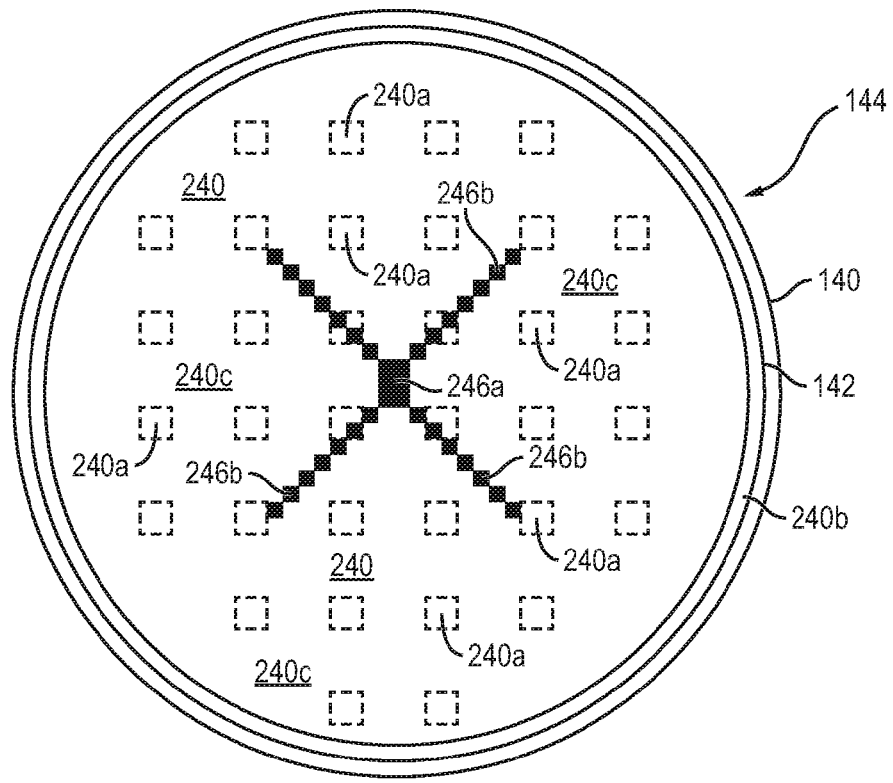
FIG. 16 illustrates another reconstituted wafer with semiconductor die and a central area and diagonal area devoid of semiconductor die.

FIG. 16 shows a plan view of circular reconstituted wafer 144 with die attach area 240 on substrate 140. Active semiconductor die 124 and non-functional dummy semiconductor die are mounted to foil layer 142 and substrate 140 in die attach area 240, similar to FIG. 15b. Active semiconductor die 124 and dummy semiconductor die are covered by encapsulant 146, i.e., consistent with FIG. 3d. Substrate 140 has sufficient size to accommodate multiple semiconductor die 124 and dummy semiconductor die arranged in columns and rows across the substrate. In particular, active semiconductor die 124 are mounted to die attach area 240a in an interior region of substrate 140. The interior die attach areas 240a contain clusters of multiple active semiconductor die 124, e.g., four or more active semiconductor die 124 per cluster. Active semiconductor die 124 and/or dummy semiconductor die are also mounted to die attach area 240b around a perimeter of substrate 140. The perimeter die attach areas 240b is a ring of active semiconductor die 124 and/or dummy semiconductor die, e.g., one or more active semiconductor die 124 and/or dummy semiconductor die disposed across a width of the ring. The dummy semiconductor die are disposed in die attach area 240c located between die attach areas 240a-240b. Alternatively, active semiconductor die 124 are disposed in die attach areas 240b.

To reduce the warpage of reconstituted wafer 144, certain areas of substrate 140 are depopulated of semiconductor die 124 and dummy semiconductor die to leave open space 246 shown as solid black areas, i.e., no semiconductor die are disposed in predetermined and selected areas 246 of substrate 140. In the case of FIG. 16, no semiconductor die 124 or dummy semiconductor die are disposed in area 246 of substrate 140. In other words, whereas area 246 could have accommodated one or more semiconductor die 124 or dummy semiconductor die, area 246 of substrate 140 is devoid of the potential semiconductor die. The area 246 that is devoid of semiconductor die 124 or dummy semiconductor die includes a central area 246a and diagonal area 246b in solid black extending from the central area across substrate 140.

Figure 17:
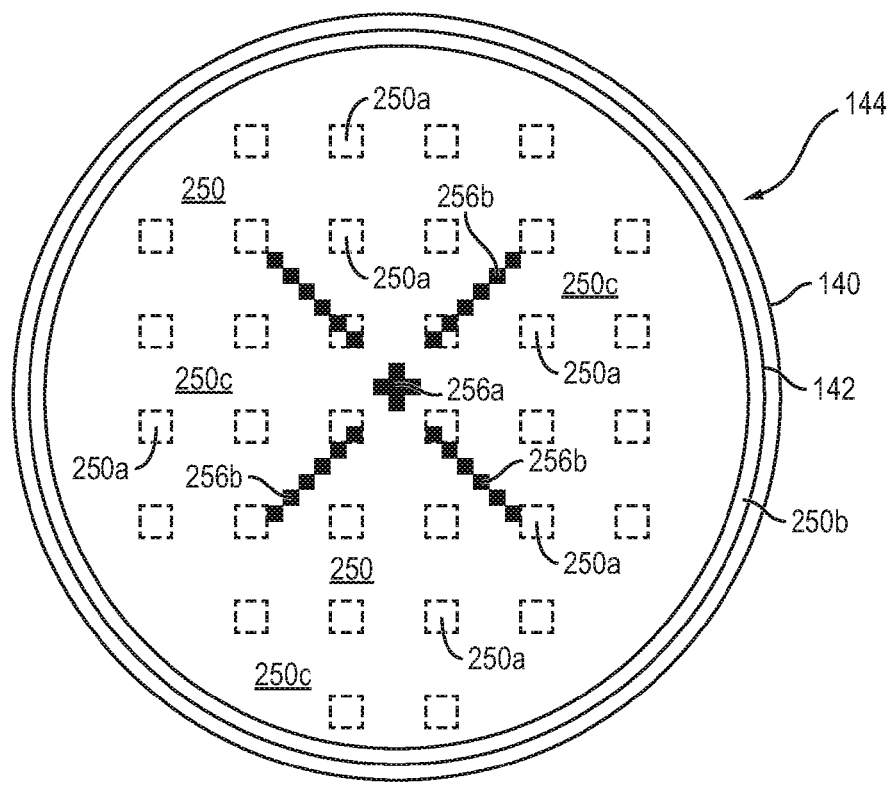
FIG. 17 illustrates another reconstituted wafer with semiconductor die and a central area and diagonal area devoid of semiconductor die.

FIG. 17 shows a plan view of circular reconstituted wafer 144 with die attach area 250 on substrate 140. Active semiconductor die 124 and non-functional dummy semiconductor die are mounted to foil layer 142 and substrate 140 in die attach area 250, similar to FIG. 15b. Active semiconductor die 124 and dummy semiconductor die are covered by encapsulant 146, i.e., consistent with FIG. 3d. Substrate 140 has sufficient size to accommodate multiple semiconductor die 124 and dummy semiconductor die arranged in columns and rows across the substrate. In particular, active semiconductor die 124 are mounted to die attach area 250a in an interior region of substrate 140. The interior die attach areas 250a contain clusters of multiple active semiconductor die 124, e.g., four or more active semiconductor die 124 per cluster. Active semiconductor die 124 and/or dummy semiconductor die are also mounted to die attach area 250b around a perimeter of substrate 140. The perimeter die attach areas 250b is a ring of active semiconductor die 124 and/or dummy semiconductor die, e.g., one or more active semiconductor die 124 and/or dummy semiconductor die disposed across a width of the ring. The dummy semiconductor die are disposed in die attach area 250c located between die attach areas 250a-250b. Alternatively, active semiconductor die 124 are disposed in die attach areas 250b.

To reduce the warpage of reconstituted wafer 144, certain areas of substrate 140 are depopulated of semiconductor die 124 and dummy semiconductor die to leave open space 256 shown as solid black areas, i.e., no semiconductor die are disposed in predetermined and selected areas 256 of substrate 140. In the case of FIG. 17, no semiconductor die 124 or dummy semiconductor die are disposed in area 256 of substrate 140. In other words, whereas area 256 could have accommodated one or more semiconductor die 124 or dummy semiconductor die, area 256 of substrate 140 is devoid of the potential semiconductor die. The area 256 that is devoid of semiconductor die 124 or dummy semiconductor die includes a central area 256a and diagonal area 256b in solid black extending across substrate 140.

Figure 18:
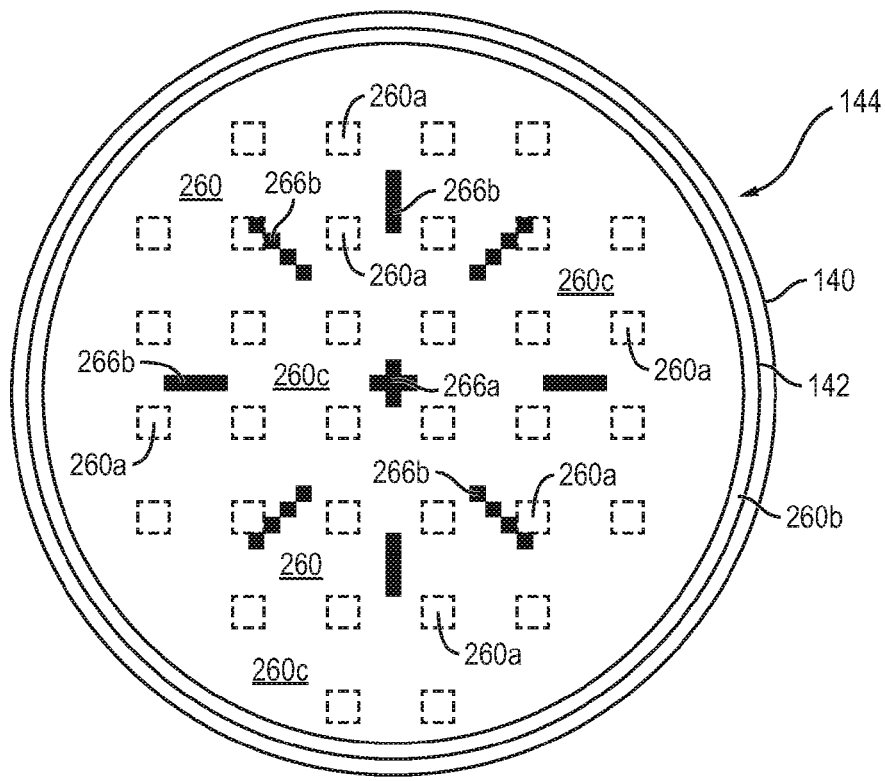
FIG. 18 illustrates a reconstituted wafer with semiconductor die and a central area and linear and diagonal area devoid of semiconductor die.

FIG. 18 shows a plan view of circular reconstituted wafer 144 with die attach area 260 on substrate 140. Active semiconductor die 124 and non-functional dummy semiconductor die are mounted to foil layer 142 and substrate 140 in die attach area 260. Active semiconductor die 124 and dummy semiconductor die are covered by encapsulant 146, i.e., consistent with FIG. 3d. Substrate 140 has sufficient size to accommodate multiple semiconductor die 124 and dummy semiconductor die arranged in columns and rows across the substrate. In particular, active semiconductor die 124 are mounted to die attach area 260a in an interior region of substrate 140. The interior die attach areas 260a contain clusters of multiple active semiconductor die 124, e.g., four or more active semiconductor die 124 per cluster. Active semiconductor die 124 and/or dummy semiconductor die are also mounted to die attach area 260b around a perimeter of substrate 140. The perimeter die attach areas 260b is a ring of active semiconductor die 124 and/or dummy semiconductor die, e.g., one or more active semiconductor die 124 and/or dummy semiconductor die disposed across a width of the ring. The dummy semiconductor die are disposed in die attach area 260c located between die attach areas 260a-260b. Alternatively, active semiconductor die 124 are disposed in die attach areas 260b.

To reduce the warpage of reconstituted wafer 144, certain areas of substrate 140 are depopulated of semiconductor die 124 and dummy semiconductor die to leave open space 266 shown as solid black areas, i.e., no semiconductor die are disposed in predetermined and selected areas 266 of substrate 140. In the case of FIG. 18, no semiconductor die 124 or dummy semiconductor die are disposed in area 266 of substrate 140. In other words, whereas area 266 could have accommodated one or more semiconductor die 124 or dummy semiconductor die, area 266 of substrate 140 is devoid of the potential semiconductor die. The area 266 that is devoid of semiconductor die 124 or dummy semiconductor die includes a central area 266a and linear or diagonal areas 266b in solid black extending across substrate 140.

Figure 19:
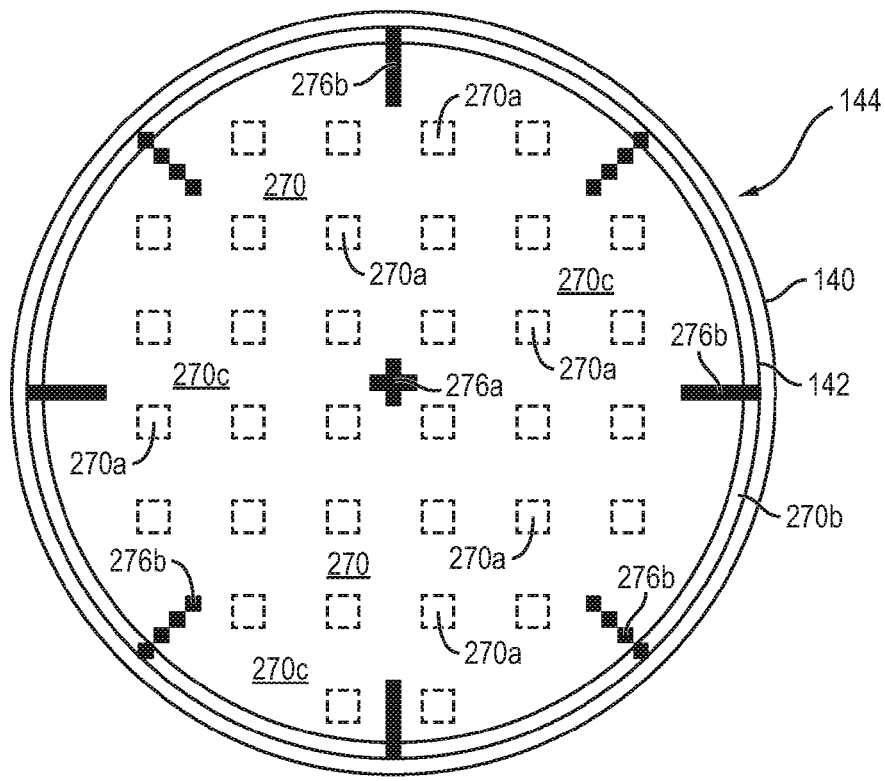
FIG. 19 illustrates another reconstituted wafer with semiconductor die and a central area and linear and diagonal area devoid of semiconductor die.

FIG. 19 shows a plan view of circular reconstituted wafer 144 with die attach area 270 on substrate 140. Active semiconductor die 124 and non-functional dummy semiconductor die are mounted to foil layer 142 and substrate 140 in die attach area 270. Active semiconductor die 124 and dummy semiconductor die are covered by encapsulant 146, i.e., consistent with FIG. 3d. Substrate 140 has sufficient size to accommodate multiple semiconductor die 124 and dummy semiconductor die arranged in columns and rows across the substrate. In particular, active semiconductor die 124 are mounted to die attach area 270a in an interior region of substrate 140. The interior die attach areas 270a contain clusters of multiple active semiconductor die 124, e.g., four or more active semiconductor die 124 per cluster. Active semiconductor die 124 and/or dummy semiconductor die are also mounted to die attach area 270b around a perimeter of substrate 140. The perimeter die attach areas 270b is a ring of active semiconductor die 124 and/or dummy semiconductor die, e.g., one or more active semiconductor die 124 disposed across a width of the ring. The dummy semiconductor die and/or dummy semiconductor die are disposed in die attach area 270c located between die attach areas 270a-270b. Alternatively, active semiconductor die 124 are disposed in die attach areas 270b.

To reduce the warpage of reconstituted wafer 144, certain areas of substrate 140 are depopulated of semiconductor die 124 and dummy semiconductor die to leave open space 276 shown as solid black areas, i.e., no semiconductor die are disposed in predetermined and selected areas of substrate 140. In the case of FIG. 19, no semiconductor die 124 or dummy semiconductor die are disposed in area 276 of substrate 140. In other words, whereas area 276 could have accommodated one or more semiconductor die 124 or dummy semiconductor die, area 276 of substrate 140 is devoid of the potential semiconductor die. The area 276 that is devoid of semiconductor die 124 or dummy semiconductor die includes a central area 276a and multiple linear or diagonal areas 276b extending across substrate 140 to die attach area 270b.

The absence of semiconductor die 124 from selected areas 152-158, 206, 216, 226, 236, 246, 256, 266, and 276 of substrate 140 in FIGS. 8-19 reduces bending stress in that area of the substrate. By leaving selected areas 152-158, 206, 216, 226, 236, 246, 256, 266, and 276 of substrate 140 devoid of semiconductor die 124, the warping effect of any mismatch between the CTE of semiconductor die 124 and the CTE of encapsulant 146 on reconstituted wafer 144 after removal of substrate 140 is reduced. In the case of a rectangular substrate 140, depopulating semiconductor die 124 from areas 152-158, 206, 216, 226, 236, 246, 256, 266, and 276 of substrate 140 has a significant effect on out-of-plane deformation. Without semiconductor die 124 in areas 152-158, 206, 216, 226, 236, 246, 256, 266, and 276, CTE mismatch and modulus are reduced as the deflection point is shifted away from the center of the substrate. Any warpage at peripheral regions of substrate 140 should dominate after removal of the substrate. Retaining semiconductor die 124 around a perimeter of substrate 140 helps maintain structural rigidity for the ease of process handling.

Figure 3G:
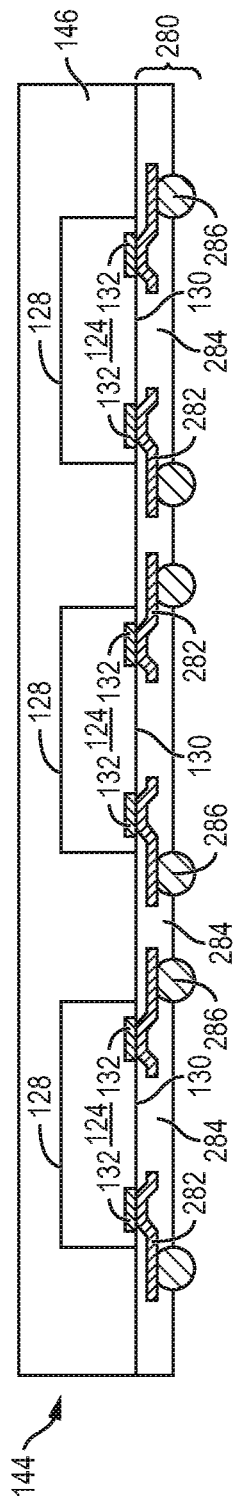

The reduction in warpage increases yield through subsequent manufacturing processes, e.g., formation of the interconnect structure of FIG. 3g, without significant loss of overall throughput, even given the fact there are fewer semiconductor die 124 per substrate 140. The yield loss due to the absence of some semiconductor die 124 from substrate 140 is mitigated in part by the lower failure rate of the semiconductor die during formation of the interconnect structure in subsequent manufacturing processes.

In addition, the absence of semiconductor die 124 from areas 152-158, 206, 216, 226, 236, 246, 256, 266, and 276 reduces stiffness of reconstituted wafer 144. Depending on the device structure, some reconstituted wafers exhibit an abrupt change of warpage, for example, directly from −2.0 mm to +2.0 mm. By selectively removing semiconductor die 124 from areas 152-158, 206, 216, 226, 236, 246, 256, 266, and 276, reconstituted wafer 144 relaxes and the warpage can be adjusted to the acceptable range.

Returning to FIG. 3g and again after removal of substrate 140, a build-up interconnect structure 280 is formed over semiconductor die 124 and encapsulant 146. Build-up interconnect structure 280 includes an electrically conductive layer or redistribution layer (RDL) 282 formed using a patterning and metal deposition process such as sputtering, electrolytic plating, or electroless plating. Conductive layer 282 can be one or more layers of Al, Cu, Sn, Ni, Au, Ag, or other suitable electrically conductive material. One portion of conductive layer 282 is electrically connected to conductive layer 132. Other portions of conductive layer 282 can be electrically common or electrically isolated depending on the design and function of semiconductor die 124.

An insulating or passivation layer 284 is formed around and between conductive layers 282 using PVD, CVD, printing, lamination, spin coating, spray coating, sintering or thermal oxidation. The insulating layer 284 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 284 is removed by an etching process or laser direction ablation (LDA) to expose conductive layer 282.

An electrically conductive bump material is deposited over conductive layer 282 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 282 using a suitable attachment or bonding process. In one embodiment, the bump material is reflowed by heating the material above its melting point to form balls or bumps 286. In some applications, bumps 286 are reflowed a second time to improve electrical contact to conductive layer 282. In one embodiment, bumps 286 are formed over an under bump metallization (UBM) layer. Bumps 286 can also be compression bonded or thermocompression bonded to conductive layer 282. Bumps 286 represent one type of interconnect structure that can be formed over conductive layer 282. The interconnect structure can also use bond wires, conductive paste, stud bump, micro bump, or other electrical interconnect.

Figure 3H:
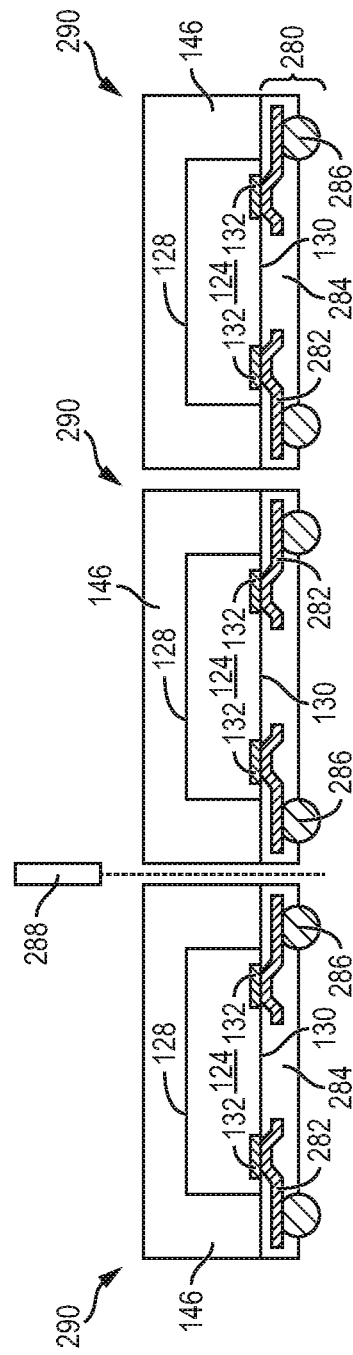

In FIG. 3h, semiconductor die 124 are singulated through encapsulant 146 with saw blade or laser cutting tool 288 into individual eWLB 290. FIG. 4 shows eWLB 290 after singulation. Semiconductor die 124 is electrically connected to conductive layer 282 and bumps 286 for external interconnect. The eWLB 290 may undergo electrical testing before or after singulation. The absence of semiconductor die 124 from selected areas of substrate 140 reduces bending stress in that area of the substrate. By leaving selected areas of substrate 140 devoid of semiconductor die 124, the warping effect of any mismatch between the CTE of semiconductor die 124 and the CTE of encapsulant 146 on reconstituted wafer 144 after removal of substrate 140 is reduced. The reduction in warpage increases yield through subsequent manufacturing processes using standard semiconductor processing tools without significant loss of overall throughput, even given the fact there are fewer semiconductor die 124 per substrate 140.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a substrate including a plurality of die attach sites each with a predetermined uniform area arranged in columns and rows across the substrate;
disposing a plurality of active semiconductor die over a first number of the die attach sites on the substrate; and
disposing a plurality of non-functional semiconductor die over a second number of the die attach sites on the substrate while leaving a third number of the die attach sites on the substrate devoid of the active semiconductor die and non-functional semiconductor die.

2. The method of claim 1, wherein the third number of the die attach sites is disposed in a central area of the substrate.

3. The method of claim 1, wherein the third number of the die attach sites is disposed in a checkerboard pattern on the substrate.

4. The method of claim 1, wherein the third number of the die attach sites is disposed in a linear or diagonal area of the substrate.

5. The method of claim 1, wherein the substrate includes a circular shape or rectangular shape.

6. The method of claim 1, further including depositing an encapsulant over the active semiconductor die, non-functional semiconductor die, and substrate.

7. A semiconductor device, comprising:
a substrate including a plurality of die attach sites;
a plurality of active semiconductor die disposed over a first number of the die attach sites on the substrate; and
a plurality of non-functional semiconductor die disposed over a second number of the die attach sites on the substrate while leaving a third number of the die attach sites on the substrate devoid of the active semiconductor die and non-functional semiconductor die.

8. The semiconductor device of claim 7, wherein the third number of the die attach sites is disposed in a central area of the substrate.

9. The semiconductor device of claim 7, wherein the third number of the die attach sites is disposed in a checkerboard pattern on the substrate.

10. The semiconductor device of claim 7, wherein the third number of the die attach sites is disposed in a linear or diagonal area of the substrate.

11. The semiconductor device of claim 7, wherein the substrate includes a circular shape or rectangular shape.

12. The semiconductor device of claim 7, further including an encapsulant deposited over the active semiconductor die, non-functional semiconductor die, and substrate.

13. The semiconductor device of claim 7, wherein each of the die attach sites has a same area.

* * * * *